United States Patent
Chu

(10) Patent No.: US 11,440,805 B2
(45) Date of Patent: Sep. 13, 2022

(54) SYSTEM AND METHOD FOR PRODUCING SILICON-CONTAINING PRODUCT BY UTILIZING SILICON MUD BYPRODUCT OF CUTTING SILICON MATERIAL WITH DIAMOND WIRE

(71) Applicant: Xi Chu, Mounds View, MN (US)

(72) Inventor: Xi Chu, Mounds View, MN (US)

( * ) Notice: Subject to any disclaimer, the term of this patent is extended or adjusted under 35 U.S.C. 154(b) by 333 days.

(21) Appl. No.: 16/499,237

(22) PCT Filed: Mar. 27, 2018

(86) PCT No.: PCT/CN2018/080710
§ 371 (c)(1),
(2) Date: Sep. 27, 2019

(87) PCT Pub. No.: WO2018/177294
PCT Pub. Date: Oct. 4, 2018

(65) Prior Publication Data
US 2021/0107799 A1   Apr. 15, 2021

(30) Foreign Application Priority Data

Mar. 27, 2017 (CN) .......................... 201710206493.8
May 5, 2017 (CN) .......................... 201710361112.3

(51) Int. Cl.
| C01B 33/18 | (2006.01) |
| C01B 32/97 | (2017.01) |
| C01B 33/023 | (2006.01) |
| C01B 33/037 | (2006.01) |

(52) U.S. Cl.
CPC ............. C01B 33/182 (2013.01); C01B 32/97 (2017.08); C01B 33/023 (2013.01); C01B 33/037 (2013.01)

(58) Field of Classification Search
CPC ......... C01B 33/02; C01B 32/97; C01B 13/20; C01B 33/182; C01B 33/021; C01B 33/18; C01B 33/113; C01B 33/03; C09C 2200/505
See application file for complete search history.

(56) References Cited

FOREIGN PATENT DOCUMENTS

| CN | 107416839 A | * 12/2017 | ............. B82Y 30/00 |
| JP | 2011051844 A | * 3/2011 | |

* cited by examiner

Primary Examiner — Anthony J Zimmer
Assistant Examiner — Logan Edward Laclair
(74) Attorney, Agent, or Firm — Charlotte C. Wilson

(57) ABSTRACT

The present application provides a system and method for producing a silicon-containing product by using a silicon sludge, which is produced by a cutting silicon material with a diamond wire. The method utilizes a high oxide layer on the surface of a silicon waste particle produced during diamond wire cutting. The surface oxide undergoes a disproportionation reaction with adjacent internal elemental silicon to form silicon monoxide, which is removed in a vapor to achieve a physical chemical reaction with a metal, a halogen gas, a hydrogen halide gas or hydrogen to form silicon-containing products of higher added value. The process realizes the large-scale, high-efficiency, energy-saving, continuous and low-cost complete recycling of silicon waste produced by diamond wire cutting of silicon material.

10 Claims, 9 Drawing Sheets

SYSTEM AND METHOD FOR PRODUCING SILICON-CONTAINING PRODUCT BY UTILIZING SILICON MUD BYPRODUCT OF CUTTING SILICON MATERIAL WITH DIAMOND WIRE

This application claims the Chinese Patent Application No. CN201710206493.8, which is submitted to the China Patent Office on Mar. 27, 2017, is entitled "A Method and System for Recycling Silicon by-products of Silicon Diamond Wire Cutting". The entire contents of this application are hereby incorporated by reference herein by reference. The application also claims to be submitted to the Chinese Patent Office on May 5, 2017 as CN201710361112.3, entitled "A Reactor and Method for Producing Silicon monoxide and its application in Lithium Ion Battery Anode Material Produced Thereof" The priority of the Chinese Patent Application, the entire contents of which is incorporated herein by reference.

TECHNICAL FIELD

The present application relates to recycling kerfs produced during silicon diamond cutting process, and more particularly to a method, equipment and system for producing silicon-containing products by using a silicon sludge which is produced by a diamond wire cutting of a silicon material.

BACKGROUND

High-purity silicon materials are drawn into single crystals and ingots and then cut into thin sheets, which can be used in semiconductor integrated circuits and solar photovoltaic cells. With the development of technology, silicon wafers are getting thinner and thinner, especially the thickness of silicon wafer of solar photovoltaic cells is comparable to the diameter of diamond wires used for cutting.

However, in the silicon wafer cutting, silicon is ground into fine powder and mixed with the abrasive material on the diamond wire. The local temperature is high during cutting, resulting in A layer of silica oxide formed on the surface of the silicon powder particle being cut.

In addition, to the useful silicon powder in the cutting liquid, there are broken diamond, resin or nickel-based alloy for fixing diamond particles on the cutting wire, and cutting wire base steel wire, pellet Subtle, different in nature, although these impurities are relatively small, only a few thousandth of the total, silica-coated silicon powder accounts for more than 99%, of which elemental silicon accounted for more than 85%, but It is still very difficult to separate the useful part of the silicon.

SUMMARY OF THE INVENTION

In view of the shortcomings of the prior art, the diamond wire cutting silicon raw material recycling has a long process flow, complicated process, high energy consumption and low effective utilization, the present invention utilizes the fact that each particle (Si) surface having a thick oxide layer generated during cutting (The characteristics of $SiO_2$) are disproportionated in a vacuum or non-oxidizing atmosphere to cause the surface oxide layer to react with the elemental silicon in close proximity to it to form sublimation of the silicon monoxide and to separate from the surface of the silicon particle to achieve the purpose of removing the surface oxide layer. Therefore, it is possible to further carry out a physicochemical reaction with a metal, a halogen gas, a hydrogen halide gas or hydrogen to further convert the silicon sludge into elemental silicon, silicon alloys, and a halosilanes, thereby producing a high value-added silicon-containing industrial product. At the same time, it has produced more valuable silicon monoxide that can be used in many fields. The avoid the disadvantages in conventional method of removing the silicon oxide layer by pickling, adding a reducing agent, etc., with high cost, environmental pollution, and waste of silicon material.

This method does not attempt to separate and recover silicon powder from the diamond-cut silicon sludge by using different density according to the conventional method. It also eliminates the two extreme misunderstandings that the silicon powder in the diamond wire-cut silicon particle is not oxidized or completely oxidized. Instead, the diamond wire-cut silicon is directly used as a reaction raw material to prepare a silicon-containing product, which has the advantages of short process, low energy consumption, complete separation and full utilization. At the same time, the effective utilization of silicon by-products of diamond wire cutting silicon raw materials and the large-scale production of silicon monoxide are combined to realize the large-scale, high-efficiency, energy-saving, continuous and low-cost complete recycling of diamond wire cut silicon kerfs.

The use of a carbonylation technique to remove metallic impurities in silicon sludge is also of great significance. Because in the current industrial production, a large amount of transition metals such as Co. Ni, Cr and other emissions are produced, mostly in the form of industrial sludge, and sometimes the transition metal penetrates into the soil to cause greater environmental damage. The treatment of such transition metal pollution has always environmental problems, traditional methods are mostly washed by pickling, but the cost is high, causing secondary environmental pollution, and also causing waste of transition metals. In view of these issues, the present application utilizes the principle that some metals can be carbonylated, realizes the purpose of dry recovery of the transition metal and the effect of full utilization, and is a novel environmental treatment method, which can not only effectively recycle and convert metal-containing impurities, but also, can also be used to repair contaminated soil by solid hazardous waste and solve the problem of waste caused environmental pollution in industrial emissions.

The synthesis and collection of silicon monoxide (SiOx) belongs to solid-gas-solid phase process. The traditional method starts from mixing high-purity silicon and high-purity silica ($SiO_2$) to form a precursor, and then sublimate the precursor into silicon monoxide by high temperature disproportionation and deposit SiOx downstream. The collection of SiOx is carried out in the downstream tube, but as the reaction time is prolonged, the inner diameter of the tube becomes smaller and smaller, the surface area of the inner wall becomes smaller and smaller, and the collection efficiency becomes lower and lower, so that the reaction has to be terminated and the overall efficiency is low. The present application is to collect gaseous silicon monoxide (inhalation by a negative pressure) onto a tubular or plate-like substrate containing a hollow-pass cooling medium, or a collecting system of a flowing granular substrate. Opposite to the conventional case, deposition of the outer surface, as time goes on, the deposition surface area is getting larger and larger, and the deposition rate is getting higher and higher. When the substrate is deposited more, the deposition can be terminated (or large particles are taken out, small particles are added), and the product is removed. Continued collection afterwards, without restrictions, can achieve large-area, continuous production methods (see FIGS. 6 and 7), greatly improving production efficiency and reducing production costs.

The present application also provides a reactor apparatus/ equipment/system for carrying out the method; a method for providing a unique precursor (raw material) of a silicon monoxide; a equipment for collecting the above-described silicon monoxide; The application of equipments for silicon materials generated. The traditional method of producing silicon monoxide, using high-purity silicon and high-purity silica grinding and mixing and then disproportionation at high temperature, the cost is high, the reaction can not be completely carried out, because after the particle intersection react to produce silicon monoxide, the silicon dioxide and silicon particles are no longer in physical contact, thus no further reaction.

The present application controls the oxide layer (SiO2) on the surface of silicon particles (Si), which may be the oxidation of silicon, or the reduction of the silicon oxide is mainly to make the molar ratio of elemental silicon to silicon dioxide in the precursor. Similar, and then disproportionate in a vacuum or inert atmosphere to react the surface oxide layer with the elemental silicon (or internal silicon dioxide and the external elemental silicon) in close proximity to it to form silicon suboxide and sublimate the silicon particle surfaces. This requires only one synthetic precursor (raw material) instead of being mixed with high purity silica and silicon as in the conventional method.

It is also an object of the present application to provide a carbonylation process and apparatus for dry removal of transition metal impurities.

In industry, a large amount of transition metals such as Co, Ni, Cr, and other emissions are produced, mostly in the form of industrial sludge. Sometimes the transition metal penetrates into the soil to cause greater environmental damage. The treatment of such transition metal pollution has always been the environment. Protection problems. The present application utilizes the characteristics that such a metal can be carbonylated, and uses a carbonylation method to treat transition metals in industrial sludge, thereby achieving the purpose of dry recovery and the effect of full utilization, and is a novel environmentally friendly treatment method.

In order to achieve the above object, in one aspect, the present application provides a method for recycling silicon waste produced by diamond wire cutting, which is characterized in that silicon dioxide on the surface of silicon waste particles is disproportionated with elemental silicon inside to form silicon monoxide collected.

Further, the present application provides a method for recycling solid silicon waste by recycling a diamond wire cutting liquid, the method comprising:

Step 1. Perform solid-liquid separation on the diamond wire cutting waste liquid to remove the volatile components, and obtain a dry powder, granule or block solid silicon waste (generally after pressure filtration, the dried silicon waste is also called silicon powder, this step is a non-essential technical feature that can be achieved by external processing).

Specifically, the waste silicon sludge is liquid removed and dried so that the volatile component therein is less than 30%, preferably less than 10%, more preferably less than 1%. The semi-dry silicon powder is dried by a drying equipment, and the material in the original cutting liquid is evaporated at 230° C. to obtain a dry solid silicon waste.

Solid-liquid separation: The diamond-cutting waste slurry has a large recovery value mainly due to the silicon powder, which must be separated by solid-liquid separation. Using conventional methods, in order to obtain a solid, the waste slurry is subjected to solid-liquid separation, and the method of solid-liquid separation may be any feasible method of the prior art.

After the separation, there is still a certain amount of liquid in the solid which can be cleaned. After the cleaning, the solid can be dried to purify the silicon, and in order to separate the silicon-containing solid, a standing method, an overflow method, and a flotation method can be employed.

In order to carry out effective solid-liquid separation, a centrifugal machine and suction filtration are used for effective separation to achieve the separation effect. Liquid flotation: precision filtration, membrane separation, suction filtration can be applied.

Drying: After the impurity removal and solid-liquid separation, the main component of the obtained solid is mainly silicon. Further drying removes the effect of moisture on the downstream reaction. Specific methods of drying: common drying equipment such as air drying, spray drying, fluidized bed drying, rotary flash drying, infrared drying, microwave drying, freeze drying, impact drying, collision drying, superheat drying, and pulsation combustion drying, heat pump drying, or the like, or a combination thereof. Drying can be done before granulation or after granulation.

Step 2: Heating the dried solid silicon waste according to the method described in the present application, and performing physical or chemical reaction to produce a silicon-containing product with added value.

The dried silicon waste is directly used as the main raw material of the reaction, and the silicon oxide layer on the surface of the silicon particles are disproportionated with the silicon adjacent thereto to form a sublimation of the silicon monoxide, and then the corresponding physical and chemical reaction is performed to obtain silicon-containing products, such as: elemental silicon, especially high-purity silicon; silicon-containing alloy; react with halogen gas, hydrogen halide gas or hydrogen to form halosilane or silane and silicone monomer, etc. The process is preferably continuous in operation.

The removal of the surface oxide layer and the production of elemental silicon and silicon alloys are mainly by physical heating.

The solid silicon waste may be a solid slag directly filtered or centrifuged by a diamond wire cutting waste liquid, or may be a solid slag which is further recovered by acid washing to remove iron, alkali to dissolve surface silicon oxide, etc. The remaining silicon waste, or a useful large-particle silicon filter cake separated by a silicon cutting solution by cyclone centrifugation or the like.

The elemental silicon and the high-purity silicon are solids containing more than 95% and 99.95% of silicon, respectively.

The silicon alloy refers to a multi-element alloy containing silicon element and at least one other metal, such as silicon aluminum, silicon magnesium, silicon aluminum magnesium, ferrosilicon, silicon calcium, silicon lithium, silicon germanium, silicon aluminum, silicon titanium, and the like.

The halogen gas is fluorine, chlorine, bromine or iodine, preferably chlorine gas;

The hydrogen halide gas is hydrogen fluoride, hydrogen chloride, hydrogen bromide or hydrogen iodide, preferably hydrogen chloride gas.

The halosilane refers to a substance in which a hydrogen atom in a silane is partially or completely substituted by a halogen.

The silicone monomer is usually monomethylsilane or dimethylsilane.

The heating process involved is resistance heat field heating, induction heating, microwave heating, direct electrode arc heating, electron beam plasma heating, reaction heating and combustion heating mode or a combination thereof, as long as the temperature required for the above reaction can be achieved.

The silicon suboxide is SiOx (x=0.1-1.9, 0.5-1.5, 0.8-1.2, 0.9-1.1).

Specific Preparation Method of Each Silicon Product

1. By-Product Elemental Silicon

The dried silicon sludge contains more than 85% silicon, and the oxide layer on the surface of the silicon particles accounts for 99% of the total. In addition to useful silicon powder, there are also broken diamonds, fixed diamond particles and nickel-based alloys on metal cutting lines, as well as cutting line base steel strands, as well as additives in cutting fluids, with fine particles and different properties. FIG. 1 shows the morphological structure of the dried silicon waste in the present application. FIG. 1a is a schematic view of the composition of the silicon waste, and FIG. 1b and FIG. 1c are scanning electron micrographs (FIG. 1b) and X-ray diffraction patterns (FIG. 1e) before the reaction of the dried silicon waste in Examples 1-4.

For silicon powder in silicon waste, general understanding of the oxidation of their surface is very limited, and no effective method has been developed to quantitatively determine the degree of oxidation. One tendency is that there is no oxidation on the surface of the silicon powder. Therefore, it is considered that the silicon powder can be melted or reacted with other chemicals to form a useful substance, which of course does not work; and more is aware of the existence of the oxide layer, so it is used in every possible way. Various chemical methods such as pickling and alkaline washing etch away the surface silica, which not only increases the cost, but also wastes the valuable oxide layer on the surface, and also causes waste and secondary pollution. On the other hand, due to the different shapes of the individual particles, the oxide layer is different. It is difficult to control the pickling and alkali cleaning. Excessive erosion is inevitable. Not only the oxide layer is removed but also the internal silicon is lost, which causes greater waste.

The present application considers that the silicon dioxide oxide layer on the surface of each silicon powder particle in the dry silicon waste is adjacent to the internal elemental silicon, and utilizes the disproportionation reaction of silicon and silicon dioxide at a high temperature to generate silicon monoxide which escape the system to achieve the removal of silica on the silicon powder particle surfaces, to make it possible to produce elemental silicon, silicon alloy and halosilane organosilicon monomer downstream, but also to reduce the cost and produce high value-added silicon monoxide.

During the disproportionation reaction, when the temperature reaches 1000° C., a small amount of siloxane oxide overflows. When the temperature reaches 1375° C., the disproportionation reaction is obvious. The melting point of silicon is 1410° C. The higher the temperature, the faster the reaction, but the temperature exceeds 1702° C. The post-silicon oxide will melt.

(1) Preparation Method of Elemental Silicon

When the silicon powder is heated to a temperature above 1000° C. in a vacuum or an inert gas, the silicon dioxide wrapped on the surface of each silicon powder particle reacts with the internal silicon to form volatile silicon monoxide and removed until all of the silica is completely reacted. Since the silica on the surface of the silicon waste powder is less than the amount of internal elemental silicon, the silicon dioxide is completely consumed and left as elemental silicon.

For continuous production, silicon powder can be added from the bottom of the molten silicon as shown in FIG. 3a, so that the silica on the surface of the silicon powder reacts with the molten silicon to form silicon monoxide and overflows from the silicon melt, leaving the elemental silicon incorporate into the silicon melt.

If only elemental silicon fine powder is needed for the halogen chemical reaction, as shown in FIG. 3b, the disproportionation reaction temperature can be controlled below the melting point of silicon 1410° C., so that the silicon powder is directly obtained, and it is not necessary to obtain a silicon block first and then grind to form silicon powder.

(2) Preparation Method of High-Purity Silicon

For the production of high-purity silicon, it is mainly necessary to remove metal such as nickel and iron from the raw material silicon waste, because in the above process, other impurities will be vaporized, and only the metal nickel and iron from the diamond wire will remain in the process. The prior art also recognizes this, so that before the drying of the silica waste, the complex multiple pickling methods are used to remove the metal components, which not only causes pollution but also depletes the silicon itself.

The present invention adopts a dry carbonylating method for removing metal, using nickel and iron to react with carbon monoxide at 80-120° C. and 10-100 MPa to produce a gas carbonyl nickel overflow, and nickel carbonyl can be reduced to metal nickel for regeneration, which can reduce pollution and recycle metals such as nickel and iron in silicon waste.

Thus, high-purity silicon can be prepared by removing the metal powder in advance (see below).

2. Preparation Method of Silicon-Containing Alloy

In the above process, depending on the silicon and silica contents in the raw silicon waste, and the composition requirements of the silicon alloys (such as silicon aluminum, silicon magnesium, ferrosilicon, silicon manganese, silicon calcium, etc.) first calculate how much aluminum or other metal need to be added because for different alloys the ratio of silicon to metal is different, even if the same alloy, such as silicon-aluminum alloy, has a wide range of components, and the melting point of the alloy is different under different compositions, which is completely determined by the phase diagram. Thus, for example, after the silicon powder and aluminum are added to the silicon melt, the silicon dioxide reacts with a portion of the silicon to produce a silicon monoxide overflow, and the remaining silicon and aluminum form a silicon aluminum alloy liquid to be removed.

3. Remove the Oxide Layer of Silicon Powder and Reacts with Halogen to Produce Halosilane The present invention removes the oxide layer on the surface of the silicon particle which cannot react with a halogen gas, a hydrogen halide gas or hydrogen, and obtains a silicon powder having an oxide layer on the surface, and the exposed silicon powder is further reacts with a halogen gas, a hydrogen halide gas or hydrogen to halosilanes, silicone monomer, and silanes.

This approach simplifies the process by directly interfaces with the ultimate application of silicon, achieving short processes, low energy consumption, complete separation and full utilization of silicon waste. In particular, the reaction of deoxidizing the surface of silicon particles can produce polysilicon and silicone monomers with lower raw materials cost. The most common silicone monomers include monomethylsilane and dimethylsilane.

Of course, the silicon block after melting and cooling silicon melt in the above process can also be pulverized and then reacted to form a halogen silanes.

$$Si+2Cl2 \rightarrow SiCl4$$

$$Si+HCl \rightarrow SiHCl3+H2$$

$$Si+SiCl4+H2 \rightarrow 2SiHCl3+HCl$$

A halogen-containing organosilicon monomer of the formula RnSiX4-n wherein R is a hydrocarbon functional group such as methyl, ethyl, etc., X is F, Cl, Br, I, and the corresponding organosilane is referred to as organofluorosilane, organochlorine silane, bromosilane and iodosilane. The halogen gas is fluorine, chlorine, bromine or iodine, and the hydrogen halide gas is hydrogen fluoride, hydrogen chloride, hydrogen bromide or hydrogen iodide. With the presence of high temperature, high pressure and catalyst, the solid silicon sludge reacts with halogen gas and hydrogen halide gas to react quickly. Therefore, the reaction time is not limited in this application, and the overall reaction time can be based on the reaction material and the surface area and flow speed and can be appropriately adjusted. Usually, the produced halosilane or silane product is collected by condensation after being taken out of the reactor.

When it is observed that the condensation product is no longer increased, the reaction can be stopped (or the solid silicon waste is completely reacted, that is, stopped), reaction).

According to the usual operating conditions of the present application, the contact residence time of the reaction gas with the solid silicon waste can be controlled to be from 0.01 s to 1000 s.

The conditions for controlling the gasification reaction are: a reaction temperature of 200 to 1400° C., a reaction pressure of 0.01 to 100 MPa; preferably, a reaction temperature of 300 to 1100° C., and a reaction pressure of 0.1 to 10 Mpa.

More preferably, the gasification reaction is gasified in two temperature zones: first at a low temperature of 300-350° C., and then at 500-900° C.: more preferably, the low temperature reaction stage can pass a hydrogen halide gas The high temperature reaction stage may be passed through a hydrogen halide gas and/or a halogen gas.

The catalyst comprises a metal, an alloy, and various metal compounds. Preferably, the active component of the catalyst is selected from one or more of the following:
a) precious metals, in particular palladium, platinum, rhodium, ruthenium, iridium, and alloys thereof;
b) transition metals, in particular nickel, copper, cobalt, iron, and alloys thereof;
c) alkali metals, especially sodium, potassium, lithium, calcium and their alloys;
d) rare earth metals;
e) metal salts, metal oxides; and
f) metal hydride.

Preferably, the active component of the catalyst is one or more of cobalt, copper, nickel chloride, copper chloride, cobalt chloride; further preferably, cobalt and/or cobalt chloride. The use of the catalyst is primarily to promote the reaction and can generally be used in an amount from 0.1% to 30% by weight based on the weight of the solid silica waste.

4. Preparation of Silicon Oxide

Silicon monoxide (SiOx) is an important electronic and optical material and a negative electrode additive for lithium ion batteries.

Traditionally, the production of SiOx is carried out by mixing elemental silicon and silica in molar ratios and then grinding them into powders of the order of microns (the smaller the particles, the more uniform the mixture, the more indirect the more intimate, the more favorable the reaction), and then the negative Disproportionation reaction is carried out under a negative pressurized environment (vacuum or inert gas) to a temperature above 1000° C. The higher the temperature, the faster the silicon oxide formed in the form of vapor and brought to a place where the pressure and temperature are low. It is condensed into a SiO2 solid. Where x is not strictly equal to one.

$$SiO2+Si \rightarrow SiOx$$

In this traditional process, first, the raw material cost is high, the grinding needs to consume a large amount of energy, and it is difficult to uniformly mix silicon and silica; secondly, the produced silicon monoxide is deposited in the internal wall of downstream tube of the reactor, and as the process proceeded, the internal diameter of the tube getting smaller and smaller, the collection efficiency is getting lower and lower due to the smaller surface area of the inner wall of the tube.

Finally, the material produced should be ground into fine powder before it can be added to the lithium-ion negative carbon material in order to be practically applied, all of which cause its high cost and difficult to promote on the market.

The present application provides a method for producing silicon monoxide, which comprises using elemental silicon and silicon dioxide to obtain a precursor by adjusting an elemental silicon and silica molar ratio close to 1:1 using an oxidation reaction or a reduction reaction under high temperature and high pressure conditions and using disproportionation reaction of the precursor to form silicon monoxide.

Preferably, the conditions for generating silicon monoxide include: sublimating and collecting silicon monoxide.

Preferably, the conditions for generating the silicon monoxide include: reacting the precursor in a confined space at a high temperature and a high pressure to form a silicon monoxide solid.

Preferably, the silicon monoxide is formed into a silicon monoxide vapor with the adjacent elemental silicon by a high temperature disproportionation reaction to cause the oxidation. The silicon monoxide vapor is in contacting with the battery anode material at a lower temperature to load the silicon monoxide on the pores and/or surface of the battery anode material.

The present application provides a method for producing a unique precursor (raw material) of a silicon monoxide material; an equipment for collecting the above-described silicon monoxide material; and the use of the above equipment for collecting a silicon monoxide material. The present application utilizes the principle that silicon and silicon dioxide react to form silicon monoxide, and directly reacts the silicon dioxide on the surface of the silicon waste particles with silicon immediately adjacent thereto to produce high value-added silicon monoxide.

If only silicon monoxide is produced, this is determined by the amount of silicon in the known raw silicon powder (see Example 1). The silicon to oxygen molar ratio is close to 1:1. If there is less oxide layer on the surface of the silicon powder, the silicon powder may be oxidized for a period of time, so that the composition of the oxide layer is changed to a suitable range (so that the molar ratio is close to 1:1). Conversely, if the amount of silica is excessive, chemical reduction can be achieved to achieve a molar ratio. If the ratio is similar, and then disproportionate at high temperature (above 1000° C.), silicon monoxide should be produced, which can ensure the complete reaction of all raw materials and achieve effective utilization of raw materials.

Similarly, it is also possible to add silicon dioxide or elemental silicon to adjust a raw material silicon to oxygen molar ratio. Since silicon monoxide is overflowed as a gas phase, and when it contacts the surface below the melting point temperature, it will be deposited as a solid. The composition determination of silicon monoxide and the equipment and method of collecting silicon monoxide are described in detail in the embodiment.

In the method of the present application, the raw material is subjected to oxidation, reduction or physical mixing component ratio at the time of synthesizing the precursor. The reducing agent is at least one selected from the group consisting of hydrogen, carbon monoxide, carbon, and metal; preferably, the reducing agent is carbon monoxide or carbon; and the oxidizing agent is at least one selected from the group consisting of oxygen, steam, and nitrogen oxide.

In the method of the present application, the conditions for controlling the redox reaction to prepare the silicon monoxide precursor are: reaction temperature 200-2800° C. (300-2500° C. preferably 500-2000° C., preferably 600-1500° C.), The reaction pressure is from 0.01 to 100 MPa, preferably, the reaction temperature is from 600 to 1500° C., the reaction pressure is from 0.1 to 10 MPa.

Pure silicon reacts with oxygen in the air at room temperature to form a protective layer of silicon dioxide. However, this protective layer has only a few nanometers of protective interior which is not further oxidized. To form a thick oxide layer, it is necessary to increase the temperature and increase the oxidant pressure to accelerate the formation of the oxide layer. The material is optionally pressure molded, and the order is not limited.

The silicon monoxide precursor component formed in the present application is SiOx (X=0.1-1.9, preferably 0.5-1.5, preferably 0.8-1.2, preferably 0.9-1.1).

The reaction temperature for generating silicon oxide gas from the silicon oxide precursor is 1000-2800° C. preferably 1000-2000° C., preferably 1325-1500° C. under vacuum (pressure less than 0.1 MPa) or in an inert gas (The pressure is 0.001-10 MPa, preferably 0.01-0.1 MPa) disproportionation of silicon and silicon dioxide to form a sublimation gas of silicon monoxide (in the molten state of silicon the silicon monoxide formed by disproportionation also overflows. The silicon monoxide melting point is 1702° C.), and the heating method can be any direct and indirect form.

Other Operations that can be Performed During the Above Reaction (1) Optional metal removal: Metal iron nickel scraps on the cutting wire are generated during the cutting process. These metal chips will enter the waste slurry. In order to obtain pure chlorosilane and smooth reaction, these should be removed. Iron removal prevents the formation of chlorides during the chlorination reaction, which, together with the chlorosilanes, enters the distillation system, increasing the difficulty of distillation and reducing the purity of the chlorosilanes. Similarly, if the high-purity silicon is to be produced as a by-product, the metal impurities should be removed as much as possible.

Traditional methods include pickling and magnetic separation. The former introduces acid, and magnetic separation can achieve the purpose of removing iron. This application uses magnetic iron removal, so the impurity removal is placed at this stage of the treatment, which can reduce the formation of iron oxide during the recovery process and increase the removal rate of iron before the reaction. Since iron is oxidized during the experiment, magnetic separation can be selectively used in the present application. In order to improve the iron removal efficiency and reduce the burden of iron removal by the carbonylation method, the removal of iron is placed in the first step.

This application does not recommend pickling, but we can also use the silicon sludge after pickling by the manufacturer, as described above in the introduction of high-purity silicon. Because the main impurities in this application contain nickel and iron, this application uses carbonylation instead. The method comprises the steps of removing nickel and iron. The matrix method is that the dried silicon sludge reacts with carbon monoxide to form a carbonyl metal to be volatilized and removed (indicated in FIG. 2), which belongs to the dry method to remove impurities and has less pollution, and the formed carbonyl metal can be converted into a metal element further. Benefits, this method can also be applied to the recycling of metal-containing solid waste to solve important environmental problems. Although the principle of carbonylation has been widely applied in other fields, it has not been reported in the field of treating sewage metal that is superior to the conventional method.

Ni (impurities in silica waste)+4CO—Ni(CO)4

Ni(CO)4-Ni (product)+4CO (2) Optional Press Molding

In the method of the present application, the solid material may be pulverized, ground, or granulated before the disproportionation reaction.

Specifically, it may be selected to be suitable for pulverization, grinding or granulation depending on the operational requirements of the reactor. According to a specific embodiment of the present application, in general, the pulverization may be to pulverize the solid silicon sludge to below 30 mesh, and the grinding may be to grind the solid silicon sludge to below 20 micrometers, and the purpose of pulverization or grinding is to make the solid material in contact with the gas for the reaction.

The purpose of granulation is mainly to avoid blowing off the material when the gas velocity is too high, and the silicon waste and the catalyst can be granulated separately or mixed granulation; in the case of granulation, the gas and solid materials can be appropriately increased, the residence time for the reaction to be sufficient. Forming by a pressurized method or a granulation method.

Alternative addition molding: molding with addition of silica SiO2, carbon C and a metal-containing catalyst; press molding or granulation.

(3) Alternative rectification: Separation of different chlorosilanes in the product by physical separation (depending on the boiling point).

The method of the present application also includes a process of further rectifying the produced halosilane. The specific rectification separation can be carried out according to the conventional operations in the art, and will not be described in detail in the present application.

The disproportionation reaction of the present application is an exothermic reaction, and a large amount of thermal energy is generated during the reaction, and the reaction temperature needs to be controlled (the reactor is usually cooled down during the reaction. Thus, the coolant can utilize water or water vapor, and the heat taken out can be used for the drying of the silicon waste before the reaction, drying can be achieved by using a fluidized bed, a fixed bed, a moving car, etc. to achieve the desired effect).

Steam can be used for distillation and purification of halosilanes. The compound produced in the halogenation reaction contains tetrahaksilane, trihalohydrogen silicon, and a halogen gas. This is easily purified by a distillation unit that separates the different halosilanes in the product by physical separation (due to their different boiling points) to obtain the desired quality and purity of the chlorosilane product, either for sale or as a downstream silica, polysilicon or silicone production raw materials.

(4) Optional Addition of Material Balance Reaction

In the method of the present application, depending on the composition of the solid silicon waste, solid slag (not just the catalyst) may remain after the disproportionation reaction, and the solid slag may be incorporated into the raw material silicon sludge to be reacted in the next batch reaction. Alternatively, silica and/or carbon may be added to the raw solid silicon sludge to balance the reaction, or oxygen may be introduced to reduce the reaction remaining while or after the introduction of the halogen gas, the hydrogen halide gas or the hydrogen gas for all the slag is reacted with less residue.

Among them, the method of adding silicon dioxide and/or carbon may be to incorporate some biomass such as carbonized rice husk or the like into the solid silicon waste. The silica and/or carbon may be usually incorporated in an amount of from 1% to 30% by weight based on the weight of the solid silicon sludge. In industrial production, the specific addition amount of silica and/or carbon may be previously determined by a small test according to the product requirements, determine. The incorporated silica and/or carbon can be comminuted, ground or granulated with the solid silica waste. The specific amount of the reducing gas to be fed can also be determined as needed depending on the amount of the remaining solid slag.

Determination of the Exact Content of Silicon in Silicon Waste

In the process of this application, the problem of the precise content of silicon in silicon waste is also plagued, by a long-term extensive experiment, finally we developed the method for accurately determining silicon and silicon dioxide in silicon waste. Because:

1. Since the main components in the silicon waste are silicon and oxygen, the total silicon content can only be obtained by X-ray fluorescence spectrometry or plasma spectroscopy, and the oxygen content cannot be quantitatively analyzed;
2. Although the information of silicon oxide can be obtained by using X-ray photoelectron spectroscopy, if the surface of silicon is oxidized, it is difficult to accurately analyze the content of internal silicon. In addition, XPS is a semi-quantitative analysis and cannot obtain accurate quantitative information:
3. Using the difference in density between silicon and silicon oxide, since the density of the two is close and the density data is greatly affected by the source of the sample, a reliable density value of the true state of silicon and silicon oxide in the sample cannot be obtained. There is also no operability;
4. A large number of analyses were performed on silicon and silicon oxide by full-spectrum fitting using X-ray diffraction. Since silicon oxide has an amorphous state and there are several crystal states of silicon oxide, it is unlikely that silicon oxides in different states can be analyzed;
5. Quantitative analysis of the mixture by solid nuclear magnetic method, taking into account the measurement accuracy of NMR, for semi-quantitative analysis may get better results, such as quantitative analysis, almost impossible;
6. By comparison of various means, gravimetric analysis is a better choice.

The main idea is: the high temperature in the air makes the silicon in the sample completely oxidized to silicon dioxide, and the silicon content is reversed by the increase of mass. Of course, this method has a premise that the sample does not have mass changes of other components at high temperatures. Based on the above analysis, the silicon and silica mixture samples were analyzed by thermogravimetric method and the ideal results were obtained: 85% silicon and silica on its surface constituted more than 99% of the mass.

Total Reaction Equipment

The present application also includes an apparatus for implementing the above method of recycling diamond wire silicon cutting waste, the apparatus comprising:

Drying system: drying the silicon waste powder to remove all volatile components therein;

Reactor feed system: the dried silicon waste is sent to the interior of the reactor system for reaction, preferably a continuous feed process, more preferably gas transfer or screw transfer;

Heating system: the reactor system is brought to a desired reaction temperature, and the heating used is one of resistance heating field heating, induction heating, microwave heating, direct electrode are, electron beam, plasma heating, combustion heating, or the like;

Reactor system: a container with an inlet and outlet, carrying silicon waste, receiving heating, and continuously removing the product, which may be one of a fluidized bed, a dilute phase flow bed, a spouted bed, a fixed bed or a moving bed or combination;

Product Collection System 1: is a product collection system that collects the silicon monoxide that is excluded from the reactor system, and the disproportionation reaction produces a gas that is led to the reactor and condensed for collection. A collection system that converts it from a gas phase to a solid (see detailed description below).

Product Collection System 2: is a system that collects elemental silicon or silicon alloys that are excluded from the reactor system and collects them as a melt or solid phase powder.

Optionally, the apparatus further includes a carbonylation system for removing metal elements from the silicon sludge, preferably one of a fluidized bed, a dilute phase gas flow bed, a spouted bed, a fixed bed or a moving bed, or a combination thereof.

As shown in FIG. 3, the dried silicon powder (and its ingredients) is fed from a hopper 301 and injected into the melter 304 through a screw feeder 303. The smelter 304 is heated by the induction heating element 302 to melt the silicon material that has melted therein to form a melt, which produces silicon monoxide SiOx gas which is collected by the top through 305. As the silicon material is continuously added, the melt volume is increased and then flows from the upper melt outlet through line 306 into collector 307, which is protected by vacuum or inert gas.

FIG. 4 is another similar system that belongs to a moving bed operation. The dried silicon waste powder is passed through a charging equipment 401 and 402 to a heating section 403 which is open above and connected to a vacuum collection equipment 405. Different from the previous reactor, the heating temperature is lower than the melting point of silicon. When the dry powder of silicon sludge is close to reach the heating section, the oxide layer on the surface of the particle reacts with the internal elemental silicon to produce silicon monoxide from the upper part of the open section to the vacuum collection chamber 05 until all the surface oxide layers are completely reacted, and the remaining silicon powder becomes elemental silicon powder, and the elemental silicon is pushed forward to the silicon powder collection chamber 404.

The main function of the equipment is to remove the oxide layer on the surface of the silicon waste particles, making it possible to convert it into elemental silicon, silicon alloy, chlorosilanes, and by-produced silicon monoxide.

Removal of surface oxide layer of silicon particles (in common): Since silicon oxide and silicon coexist, an oxide layer is formed on the surface of each particle, and the surface oxide layer is adjacent to the internal elemental silicon, and the disproportionation reaction of silicon oxide and silicon is used to produce silicon monoxide through gas phase sublimation. The silicon monoxide re-condenses into solid state silicon monoxide at a low temperature downstream.

If the temperature at the time of disproportionation is higher than the melting point of silicon or the melting point of the alloy, the generated elemental silicon, silicon-containing alloy, and silicon monoxide are continuously discharged as shown in FIG. 3.

If the disproportionation temperature is lower than the melting point of silicon (FIG. 4), and the remaining silicon can be present in the form of a powder, it can be reacted with halogen to produce chlorosilane or silicone without pulverizing the silicon. The disproportionation reaction with a halogen gas or a hydrogen halide is carried out in the form of a powder or a granulated particle to form a halosilane such as a tri-halogenated silane or a silicon tetrahalide and a silicone monomer.

The reactor for carrying out the disproportionation reaction; in particular, for the dried silicon sludge, since the particles are extremely fine, the fine powder is not further granulated, and it is difficult to directly use the conventional reactor type to produce.

Carbonylation Unit

In the current industrial production, a large amount of waste containing transition metals such as Co, Ni, and Cr are produced, mostly in the form of industrial sludge. Sometimes the transition metal penetrates into the soil to cause greater environmental damage. The treatment of such transition metal pollution has always been environmental protection challenge. In response to this problem, the present application utilizes the principle that such a metal can be carbonylated, realizes the purpose of dry recovery of transition metal and the effect of full utilization. It is a novel environmental protection treatment method, which solves the environment pollution of transition metal in industrial waste, and recover the wasted metals as resources.

Optionally, the apparatus further includes a carbonylation system for removing metallic elements from the silicon waste, the method comprising: reactor feed system: the dried silicon sludge is sent to the inside of the reactor system for reaction, preferably a continuous feeding process, more preferably high pressure gas delivery or screw delivery, while adding carbon monoxide to the reactor.

Heating system: the reactor system is brought to the desired reaction temperature, and the heating used is one of resistance electric field heating, induction heating, microwave heating, direct electrode are, plasma heating, combustion heating or a combination thereof, preferably for replacement Thermal heating because the reaction temperature is low, generally less than 200° C.

Reactor system: a container with an inlet and outlet, carrying silicon waste, receiving heating, and continuously removing the product, which may be a fluidized bed, a dilute phase flow bed, a spouted bed, a fixed bed or a moving bed.

Product Collection System: A product collection system that collects carbonyl compounds that are excluded from the reactor system, draws the reaction to produce a gas exiting the reactor, and condenses for collection.

Since the silicon powder is fine and the scale is on the order of several tens of micrometers, the general chemical reactor cannot be applied. Conventional reactors can be used after molding the powder, but metallic iron and nickel particles are difficult to completely react internally. Preferably, the reactor is a fluidized bed, a dilute phase flow bed, a spouted bed, a fixed bed or a moving bed.

After the production of nickel carbonyl, it can also be converted into a elemental nickel in the form of fine powder or granules, which is mainly for further specific applications downstream.

Chlorosilane Production Equipment

A reactor unit that performs a gasification reaction with a halogen includes:

Reactor feed system: The silicon sludge after removing the surface oxide layer is sent to the inside of the reactor system for reaction, preferably a continuous feeding process, more preferably gas delivery or screw conveying; that is, solid material (solid silicon waste, and the catalyst, the solid materials may be pre-mixed and uniformly) charged into the reactor, and the gas required for the reaction is introduced into the reactor, and the halogen gas, the hydrogen halide gas or the hydrogen gas is fed into the anti-gasification reaction.

Heating system and temperature control: the reactor system is brought to the desired reaction temperature, and the heating used is one of resistance heating, induction heating, microwave heating, reaction heating, plasma heating, combustion heating mode or a combination thereof.

Reactor system: with inlet and outlet, carrying silicon waste, allowing halogen gas, hydrogen halide gas or hydrogen to enter into and in full contact with solid silicon waste powder, receiving heat, allowing the product to be continuously removed, it can be a fluidized bed, One of a dilute phase flow bed, a spouted bed, a fixed bed or a moving bed or a combination thereof, preferably a gas swirling bed (moving bed of a single-sided distributor).

Product Collection System: A product collection system that collects the gas evolution reaction to remove the gas from the reactor and condense it for collection. The disproportionation reaction is carried out at a suitable temperature, and the reaction product (gaseous state) is led out to the reactor, and the liquid halosilane or silane is collected by condensation, and the reaction tail gas can be returned to the reactor for use or recovered by an alkaline solution treatment.

As shown in FIG. 8, the apparatus for realizing the method for converting the solid silicon waste separated by the diamond cutting waste slurry of the present invention into a halogen silane (the experiment is limited to chlorosilane) includes:

(1) Reactor 1 for carrying out a disproportionation reaction; the reactor is provided with a temperature control equipment (not shown). Specifically, the reactor may be an entrained flow bed, a fluidized bed, a fixed bed or a moving bed, preferably a fixed bed or an entrained bed. Since the material is fine after drying, the conventional fluidized bed reaction is difficult to control, and a large number of the reaction silicon sludge is brought downstream to cause material waste and pipe blockage, and the gas flow bed allows the material to be completely mixed with the reaction gas, greatly increasing the reaction surface.

As shown, the middle of the reactor is the main reaction zone 811 for filling the solid silicon waste; the lower part of the reactor (shown as a cone in the figure) is provided with a quartz particle filling zone 812, which can fill 3-15 mm of quartz particles, when the gas A gas distributor can be formed from the bottom to the quartz particle filling zone; a quartz wool filling zone 813 is disposed on the upper portion of the reactor, mainly for preventing the silicon waste powder from being carried out of the reactor when the gas flow is unstable. The bottom of the reactor is provided with a raw material gas inlet, and the top is provided with a product gas outlet.

(2) Feeding a halogen gas, a hydrogen halide gas or hydrogen into the intake system 2 of the reactor; the intake system 2 mainly supplies a raw material gas (halogen gas, hydrogen halide gas or hydrogen) through the bottom of the reactor with a material gas The inlet is fed into the reactor and flows from bottom to top through the main reaction zone filled with solid silicon waste, and reacts with the solid silicon waste to form a product gas (halosilane or silane); the intake system 2 shown in the figure includes gas arranged in series through the pipeline. Bottle and gas dryer 823. Only two cylinders 821, 822 are schematically illustrated in the drawing for holding different gases, one of which may be an inert gas such as nitrogen for purging the reactor before the reaction; it is understood that a plurality of cylinders It is set in parallel. The gas drying equipment 823 may be a zeolite-filled vessel for absorbing moisture that may be contained in the feed gas to prevent carryover of moisture into the reactor.

(3) A product collection system 3 in which the disproportionation reaction gas is taken out of the reactor and condensed for collection. The product collection system 3 mainly comprises a condenser 831, a liquid collection equipment 832 and an exhaust gas treatment equipment 833 arranged in series through a pipeline, wherein the condenser 31 is mainly used for condensing the product gas derived from the reactor 1 into a liquid, after condensation The liquid is collected by the liquid collecting equipment 832, and the uncondensed exhaust gas (mainly unreacted halogen gas, hydrogen halide gas) is passed through an exhaust gas treatment equipment (mainly a container containing an alkaline solution, and an alkaline solution is used to absorb unreacted halogen in the exhaust gas). Gas, hydrogen halide gas) treatment, in order to ensure the absorption of halogen gas or hydrogen halide gas which may exist in the exhaust gas, a plurality of exhaust gas treatment equipments may be arranged in series (two exhaust gas treatment equipments 833, 834 are arranged as shown)

Silicon Monoxide Equipment

The present application also includes a method and apparatus for highly effective production of silicon monoxide, including: means for effecting the above-described recycling of diamond wire-cut silicon sludge to produce silicon monoxide and a collection method, the apparatus includes:

Reactor feed system: transporting the dried silicon monoxide precursor to the interior of the reactor system for reaction, preferably a continuous feed process, more preferably gas delivery or screw delivery.

Heating system: the reactor system is brought to the desired reaction temperature, and the heating used is one of the resistance heating, induction heating, microwave heating, direct electrode arc, electron beam, plasma heating, combustion heating, or a combination thereof.

Reactor system: a vessel with an inlet and outlet, carrying a precursor of silicon monoxide, receiving heat, and cooling removing the product, which may be one of a fluidized bed, a dilute phase flow bed, a spouted bed, a fixed bed or a moving bed or a combination of them.

Product collection system: it collects the silicon monoxide that is excluded from the reactor system after the disproportionation reaction as a gas phase that is come out of the reactor and condensed for collection.

The collection of silicon oxide is a process from gas phase to solid phase. The traditional method of depositing silicon monoxide is carried out in the downstream tube of the reactor. As the reaction time is extended, the inner diameter of the tube becomes smaller and smaller, the surface area of the inner wall becomes smaller and smaller, and the collection efficiency becomes less and less effective. The reaction has to be terminated and the overall efficiency is low. This application invention adopts a large-receiving area, continuous mode (see FIGS. 6 and 7), which greatly improves production efficiency and reduces production costs. Deposited on the surface of the internally cooled tube (or plate) or on the surface of the flowing particles, as time goes, the surface area is getting larger and larger, there is no limit, and the deposition efficiency is getting higher and higher.

As shown in FIG. 6, the silicon monoxide precursor is fed into the reactor and flows from bottom to top through the main reaction zone filled with the solid precursor, which is heated to form the silicon monoxide vapor into the deposition cavity, and then deposited on the plate and the hollow bar substrates. The center of the substrate can hollow selectively pass through a cooling medium to lower the temperature while taking heat out for drying.

Control the reaction temperature (the reactor usually needs to be cooled down during the reaction. The coolant can use water or water vapor, and the heat can be used to dry the silicon waste before the reaction. The drying can be carried out in a fluidized bed, fixed bed or moving bed to achieve the desired drying effect.

As shown in FIG. 6, the powder of silicon monoxide precursor is pressed into a bulk, which is broken into particles 600 having a particle size of 3 to 10 mm, and the silicon monoxide precursor particles or powder 600 is added to the reaction by a double lock hopper 601 and falling into the crucible 603, the crucible is heated to 1400° C. by the heating element 602, and the sublimated silicon monoxide 607 is introduced to the collecting chamber 604 and deposited on the surface of the tubular substrate 606 (which may also be flat or other shape). The tubular 606 substrate is a hollow interior cooled by a coolant 608, waiting for the silicon monoxide to deposit after the substrate is deposited, removing the product, and then reassembling the equipment to continue production.

FIG. 7 shows a particle deposition system apparatus in the present application. In addition to the system described above in FIG. 6, it also includes particle circulation transport as well as dispersion and collection, screening, and seed preparation systems.

As shown in FIG. 7a, the silicon monoxide precursor particles 700 are added to the reactor by the double lock hopper 701 and fall into the crucible 703, and the crucible is heated by the heating element 702 to above 1000° C. and the sublimated silicon oxide 707 is overflowed from the crucible drifting into the collection chamber and depositing on the surface of the granular silicon monoxide substrate 708. 705 is a vacuum outlet, and a vacuum vent 705 has a stepped louver type gas permeable inclined plate on the left side (not shown, see FIG. 7b), 706 is a particle circulation unit. The particles are transported from the bottom tank to the top and then moved to the bottom in uninterrupted cycle mode, while in the reactor chamber, the surface is kept in full contact with the silicon monoxide vapor and the particle size continues to grow. There is also a screening equipment (not shown) between the particle circulator 006 and the top that leaves the large particles discharged, and the small particles are transported to the top to continue to circulate in the reactor and grow.

When there are too few small particles in the system, new smaller particle seeds can be added to ensure that the system is operating in a steady state. The system is not only suitable for all gas-to-solid phase material deposition processes, but also avoids the drawbacks of conventional methods such as clogging of the distributor in the fluidized bed, difficulty in heat handling, and limited particle size.

FIG. 7b shows a gas-distributor-less particle reactor of the present application further comprising a stepped louver type gas permeable baffle that functions to carry particles flowing from the top and move them down on the baffle. It does not fall as quickly as the free falling, increasing the residence time of the particles in the reactor body and increasing the deposition efficiency. At the same time, there is no limit to the particle size, as in conventional methods such as fluidized bed reactor there is a limitation of the particle size depending on the flow velocity of the fluidized gas, and large particles are generally cannot be prepared.

Reactor material: The material of the reactor needs to be able to meet the mechanical strength without causing pollution, or the inner liner can be the same or matched with the produced material without causing pollution. For example, when producing silicon monoxide, quartz, high-purity single crystal silicon, polycrystalline silicon, silicon carbide, silicon nitride, etc., high-purity polycrystalline silicon, high-purity single crystal silicon, polycrystalline silicon, silicon carbide, silicon nitride, etc. To produce carbonyl nickel pellets are made of metallic nickel or stainless steel.

Gas (gas phase) distributor: All gas-solid reactions are inevitable involving how to effectively pass the gas through the distributor to the solid, especially the surface of the particle. Because of this, the surface of the distributor is the surface of the substrate that is first contacted with the gas to be deposited first, so that the vent hole (spacing) of the distributor must be blocked first, and it is difficult to keep it open for a longer time. The reactor of the present application is a distributor-less gas-solid reactor, and the gas does not need to be directly contacted with the solid particles through the distributor, thereby avoiding the fatal drawback of the conventional method.

Circulation system: Any existing method such as gas delivery, vacuum loading, mechanical handling, etc. can be taken.

Thermal management: Gas-solid reaction is inevitably accompanied by a large amount of heat emission and/or absorption, and these heats occur at the deposition interface. How to effectively manage the thermal energy of the reaction interface and quickly and effectively reach the temperature required for the reaction has always been the most difficult problem in the industrial application industry. In addition to the conventional heating and cooling modes described above, the present application, on the one hand, employs a hollow passage cooling medium cooling in the illustrated baffle to improve the efficiency of conversion to high-temperature steam to solid particles similar to that of silicon monoxide. On the other hand, in addition to conventional external preheating (cooling), a direct resistance heating baffle (as it is itself conductive) is provided for the purpose of increasing the surface temperature of the particles. Of course, if the particulate material itself is electrically conductive under the reaction conditions, it is also possible to add electric heating to the electrodes on both sides of the particle flow.

SUMMARY OF THE INVENTION

The present invention relates to a method for recycling diamond wire cutting silicon waste which has been separated from a liquid and dried through chemically and physically reactions to form a silicon-containing product.

The method is characterized in that the drying is at 230° C. until no gas volatiles comes out, and the drying equipment is air flow drying, spray drying, fluidized bed drying, rotary flash drying, infrared drying, microwave drying, freeze drying, impact drying, countercurrent drying, superheat drying, pulsating combustion drying, and heat pump drying, or a combination thereof.

(1) In addition, the silicon-containing product is elemental silicon, high-purity silicon, silicon alloy, silicon monoxide, and halogen silane and silicone monomer.

(2) The chemical reaction is a disproportionation reaction between the silicon dioxide on the surface of the silicon waste particles and the elemental silicon inside it to form a silicon monoxide discharge, so that further chemical reaction and physical reaction generate elemental silicon, silicon alloy and silane are possible and at the same time, silicon oxide is produced. Chemical and physical reactions mean chemical reactions and physical reactions. Wherein, when the disproportionation temperature is lower than the melting point of silicon, the elemental silicon is a powder. The disproportionation reaction (the surface oxide layer reacts with the elemental silicon in which it is in close proximity to the interior, and the sub-silicon dioxide is sublimated and separated from the surface of the silicon particle) is carried out at a high temperature and in a vacuum or an inert gas at a reaction temperature of 1200-1800° C., reaction pressure 0.01-0.1 Mpa.

(3) The physical reaction is the melting aggregation of the silicon powder particles after removing the surface oxide layer or alloying with other metals; the physical reaction (the silicon itself is melted or alloyed with other metals) is carried out at a high temperature. The reaction temperature is 500-1800° C., and the reaction pressure is 0.001-100 MPa.

(4) The chemical reaction further comprises a carbonylation reaction using carbon monoxide to carry out a carbonylation reaction with a transition metal in a silicon sludge to remove metal impurities, and the carbonylation reaction (transition metal impurities in silicon reacts with carbon monoxide) is carried out under high temperature and high pressure. The reaction temperature is 50-240° C., and the reaction pressure is 0.01-100 MPa.

(5) The chemical reaction further comprises the gasification reaction of the elemental silicon particles (after the surface oxide layer of the waste powder removed) with a halogen or a hydrogen halide to form a halogen silane and a silicone monomer; the halogen silane is $SiH_xL_{4-x}$, L=F, Cl, Br, and I; X=0, 1, 2, 3, 4. The gasification reaction (silicon with halogen, hydrogen, the halogen gas is fluorine, chlorine, bromine or iodine, the hydrogen halide gas is hydrogen fluoride, hydrogen chloride, hydrogen bromide or hydrogen iodide; it is common with high temperature and high pressure and catalyst The reaction temperature is 200-1400° C., the reaction pressure is 0.01-100 MPa, the elemental silicon is disproportionated by the silicon waste, preferably after the carbonylation reaction, and the more preferable reaction process is preferably continuous production.

(6) The silicon alloy refers to a multi-element alloy containing silicon element and at least one other metal, including silicon aluminum, silicon magnesium, ferrosilicon, silicon calcium, silicon lithium, silicon germanium, silicon aluminum, silicon titanium; The elemental silicon and the alloying element produced after the disproportionation reaction are obtained by melting. Preferably, the alloying element is added to the reactor simultaneously with the silicon waste, and the disproportionation and the melting are simultaneously performed.

(7) The process involved therein is one of resistance electric field heating, induction heating, microwave heating, direct electrode arc, electron beam, plasma heating, reaction heating and combustion heating, or a combination thereof.

(8) The present application further provides a system for implementing the method for recycling silicon diamond wire cutting waste according to claim 1, the system comprising: drying system; reactor feed system; heating system; reactor system; silicon oxide collection system: elemental silicon or silicon alloy collection system.

For a reactor for carrying out a gasification reaction with a halogen, the reactor is provided with a temperature control unit, preferably the reactor is a fluidized bed, a dilute phase gas flow bed, a spouted bed, a fixed bed or a moving bed; a hydrogen halide gas or hydrogen is fed into a reactor that is used to carry out the gasification reaction; the reactor is provided with a temperature control unit.

Preferably, the reactor is a fluidized bed, a dilute phase flow bed, a spouted bed, a fixed bed or a moving bed.

A halogen gas, a hydrogen halide gas, or a hydrogen gas is supplied to the intake system of the reactor; a gasification reaction produces a gas-derived reactor and condenses the collected product collection system.

The present application also provides a method of producing silicon oxide, characterized in that a) using a single precursor having both the necessary elemental silicon and silicon in different parts of a single particle for generating silicon monoxide. More specifically, silicon or incompletely oxidized silicon or silicon dioxide is further oxidized or reduced to a single molar ratio of elemental silicon to silicon dioxide to form a single molar ratio of silicon to oxygen, and then the silicon dioxide and the adjacent elemental silicon are formed into a sub-silicon oxide SiOx sublimation by a high-temperature disproportionation reaction and collected down stream;

b) a direct solid-state reaction to obtain a silicon monoxide solid. One of the applications of silicon oxide is the precursor of the negative electrode material of lithium ion batteries. The silicon oxide component is SiOx (X=0.1-1.9, preferably 0.5-1.5, 0.8-1.2, 0.9-1.1). The reaction temperature is from 200 to 2,800° C., preferably from 300 to 2500° C., preferably from 500 to 2,000° C., preferably from 600 to 1700° C., and the reaction pressure is from 0.01 to 100 MPa; preferably, the reaction pressure is 0.11-10 MPa. Preferably, the reaction pressure is 0.1 to 11 MPa, and the reaction atmosphere is oxidized or reduced.

The synthesis conditions for silicon monoxide from the above-mentioned precursor are: reaction temperature 200-2800° C. preferably, 500-2000° C., preferably, 600-1700° C. Reaction pressure 0.0001-100 MPa.

(a) The reaction pressure under vacuum is 0.01-100 MPa; preferably, the pressure is <1000 Pa, preferably <100 Pa, preferably <10 Pa, preferably <1.0 Pa, <0.1 Pa.

(b) The pressure of reaction in the inert gas is 0.001-10 MPa, preferably 0.01-10 MP.

(c) Under high-pressure silicon dioxide and the elemental silicon to form a silicon monoxide solid, the reaction pressure is 0.1-100 MPa, and more preferably the point reaction pressure is 1-100 MPa.

In the method and system described above, the high temperature sublimation (disproportionation reaction) forms the silicon monoxide and the process involved in the gasification and melting reaction is heated by electric resistance field heating, induction heating, microwave heating, direct electrode arc, electron beam, plasma heating, reaction heating, combustion heating, etc., are achieved by heating.

Additionally, the silicon monoxide deposition is carried out in a collection reactor which is one of a fluidized bed, a dilute phase gas flow bed, a spouted bed, a fixed bed or a moving bed or a combination thereof. The preferred silicon monoxide vapor is condensed and deposited on the surface of the rod, plate or particle, and even penetrates into the interior of the lithium ion negative electrode material particle. Preferably the dried silicon solid powder separated by the diamond silicon cutting waste slurry, and then dried. The vapor is condensed into particulate or, more preferably, the vapor silicon monoxide is directly incorporated into the negative electrode material of the lithium ion battery to form a silicon-containing high capacity negative electrode material.

The present invention also provides an apparatus for implementing the method of preparing silicon monoxide according to claims 11-14, the apparatus includes: a silicon monoxide precursor production unit, preferably, the reactor is a fluidized bed, a dilute phase flow bed, a spouted bed, a fixed bed or a moving bed; a reactor for disproportionation reaction to form silicon monoxide: the reactor is provided with a temperature control unit to heat the crucible; and the disproportionation reaction produces a silicon monoxide vapor and collected. The collection system is one of a plate, a rod, and a bed of particles or a combination thereof in a vacuum. The plate-like, rod-like substrates in the vacuum in which the silicon monoxide is collected has a hollow structure and a cooling medium is passed through to keep the temperature low for silicon monoxide condensation. For using a bed of particles in a vacuum for collecting silicon monoxide according to claim 10, the particles being cooled during transport to the top.

The present application also provides a gas-solid reactor characterized in that there is no gas distributor on the inlet side of the reaction gas, and the gas is directly in contact with the rear surface of the solid medium. The present application also provides a method for dry recovery of metal-containing solid waste, characterized in that the metal in the solid waste material is removed by carbonylation reaction with carbon monoxide to form a metal carbonyl gas, and the gas is then converted back into a transition metal for efficient use. The carbonylation reaction is characterized in that (the transition metal impurity reacts with carbon monoxide) is carried out under the action of high temperature and high pressure and a catalyst. It is carried out under high temperature and high pressure. The reaction temperature is 50-240° C., and the reaction pressure is 0.01-100 MPa.

The Benefits Achieved by the Application

1. Using the principle of carbonylation, in addition to effectively remove the transition metal impurities, to avoid the introduction of a large amount of acid and alkali corrosion and environmentally unfriendly chemicals, and the silicon loss during pickling, it makes silicon waste to high purity silicon conversion possible and more advantageous with chlorosilane production.

2. The silicon waste recovered from the diamond wire cutting liquid is directly disproportionated after separation and drying, and the method of producing elemental silicon and silicon monoxide which solve:

(0) It is possible to convert silicon waste to elemental silicon, silicon-containing alloy, chlorosilane and avoid environmental pollution when using conventional pickling silicon surface silicon oxide to obtain elemental silicon and waste of silicon during pickling.

(1) The conventional method of reacting high-purity silicon with high-purity silicon oxide has high cost and insufficient reaction, and current application achieves effectively recycling waste and low cost, and at the same time, the present application obtains high-value added silicon monoxide, and avoids environmental pollution when pickling silicon surface oxide to obtain elemental silicon and waste of silicon during pickling.

(2) For the production of silicon oxide only in the process of disproportionation, the molar ratio of elemental silicon to silicon dioxide is similar by oxidation-reduction reaction, and the equilibrium reaction of silicon oxide is used to reduce the silicon in the silicon waste as much as possible. It is completely reacted to form silicon monoxide, which achieves the purpose of recycling silicon in silicon waste to produce high-value silicon monoxide.

3. Gasification Reaction

In the conventional process of separating silicon and impurities, it is difficult to separate due to many similarities between the properties of impurities and silicon. The present application does not deliberately separate silicon Si and impurity solids, directly uses the recovered silicon waste as a raw material, use disproportionation reaction to remove the oxide layer, and directly reacts with the halogen gas, thereby saving time and labor.

The total equipment system in the process of the invention can be continuously operated as needed, and solves the problems in the prior art: intermittent operation, excessive material loss and waste; and mismatching with the actual application.

4. A method for accurately determining silicon and silicon dioxide in silicon waste, and achieving a simple method for determining silicon content in silicon waste.

5. Reaction under vacuum and non-oxygen environment, preventing the loose structure and the silicon fine powder with thick uneven surface oxide layer, which is easily oxidized further during heating.

6. Vapor deposition

The collecting equipment of the silicon monoxide is provided with a hollow tubular substrate or a granular substrate for depositing silicon monoxide, which solves the disadvantages in traditional method of depositing silicon monoxide in the downstream tube of the reactor. In the conventional method as the reaction time is extended, the inner diameter of the tube is reduced: the smaller the diameter, the smaller the surface area of the inner wall, thus the lower the collection efficiency, and finally the reaction has to be terminated, and the overall efficiency is extremely low, while in the current application there are no such problems and the disproportionation reaction can be continuously carried out and the silicon monoxide is efficiently collected.

The present application uses a non-distributor gas-solid reactor to solve the problems of blockage, heating, pollution, particle size and the like in the conventional gas-solid reaction.

7. Directly vapor deposition of silicon monoxide vapor into the anode material of the lithium ion battery can save production cost and achieve uniform distribution.

DRAWINGS

FIG. 1 shows the morphological structure of the dried silicon waste in the present application. FIG. 1a is a schematic view of the composition of the silicon waste, and FIG. 1b and FIG. 1c are scanning electron micrographs (FIG. 1b) and X-ray diffraction patterns (FIG. 1) before the reaction of the dried silicon waste in Examples 1-4.

FIGS. 2a, b, and c are process flow diagrams of specific embodiments of the present application.

EXAMPLES

The technical solution of the present application will be further described below with reference to the accompanying drawings and specific embodiments, which have the advantages of fewer operation steps, shorter process, cleaner separation, and favorable by-product. These examples are not intended to limit the application.

The method of the present application mainly utilizes the silicon waste obtained by solid-liquid separation and drying of diamond wire-cut silicon slurry. Among them, the operation of solid-liquid separation of the waste slurry of the diamond wire cutting can be carried out according to any feasible prior art. The resulting silicon sludge is dried to produce elemental silicon, silicon monoxide, silicon alloy, and chlorosilanes.

Example 1: Preparation and Determination of Silicon Content of Silicon Raw Materials The as received silicon waste material is grayish black, which mainly contains silicon powder and contains 10-30% liquid. Five 5 kg of the silicon waste material was placed in a quartz crucible and placed in an oven and dried at 110° C. for 24 hours until no volatile odorous gas overflowed to obtain a large piece of silicon waste, and then the bulk silicon waste was pulverized and repeatedly baked to 230° C. until The silicon waste was 100 mesh or less without weight loss, and finally 3943 g of dry silicon waste was obtained. All the silicon sludge prepared by this method was used as a raw material in all experiments thereafter.

Figure 1A:
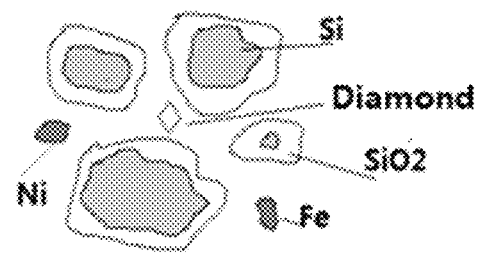
Figure 1B:
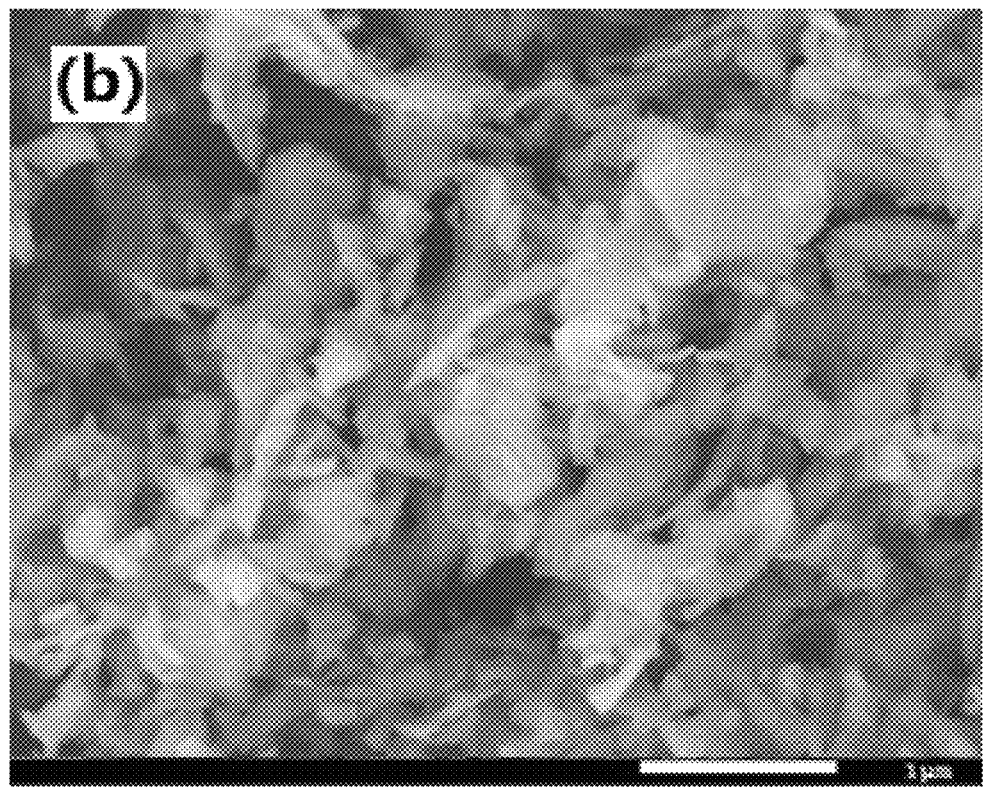
Figure 1C:
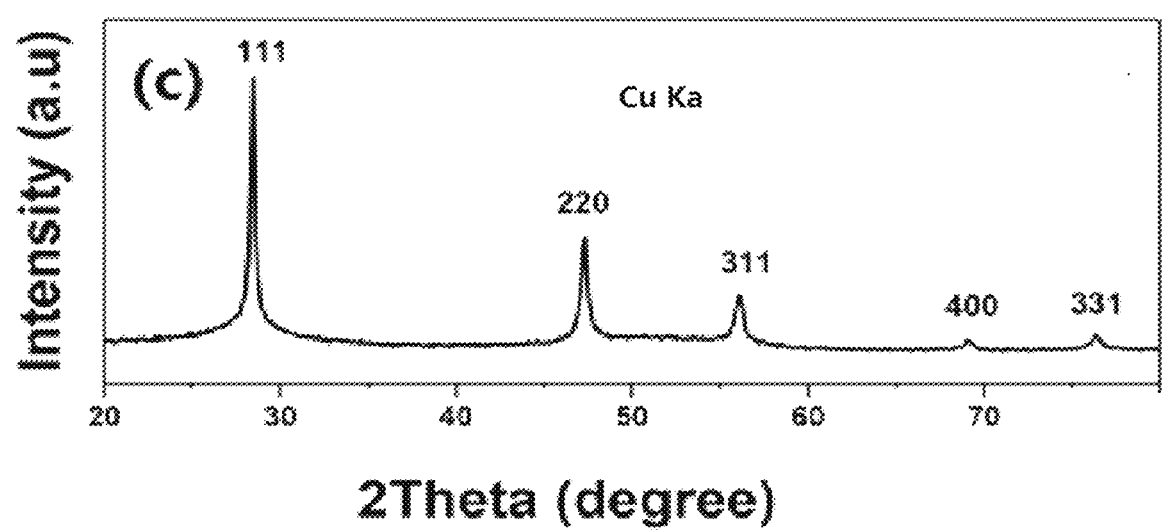
Figure 2A:
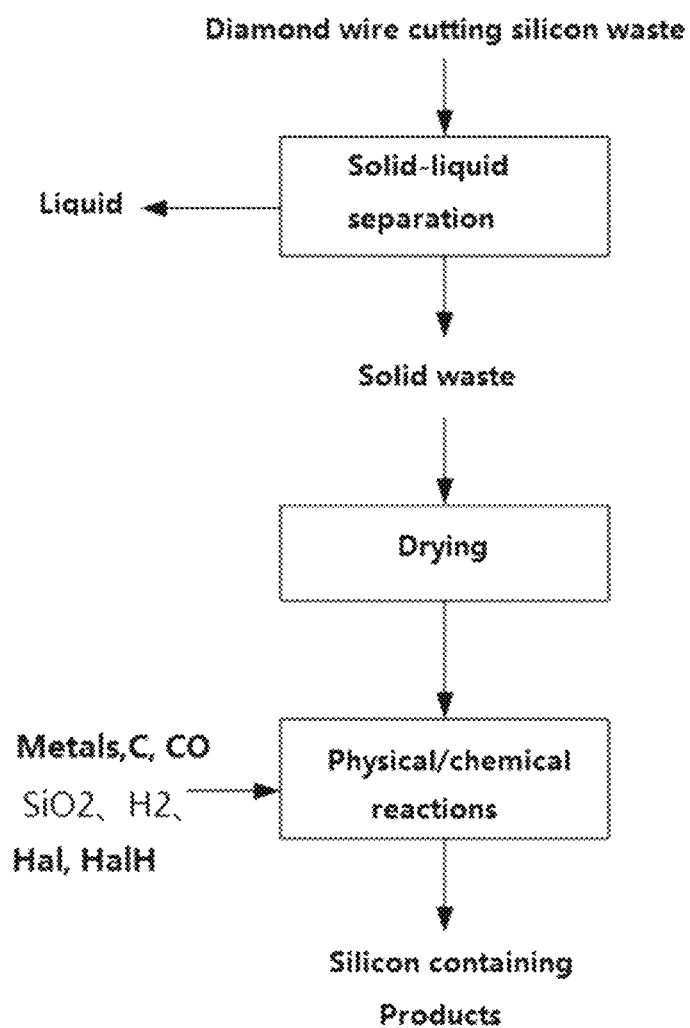
Figure 2B:
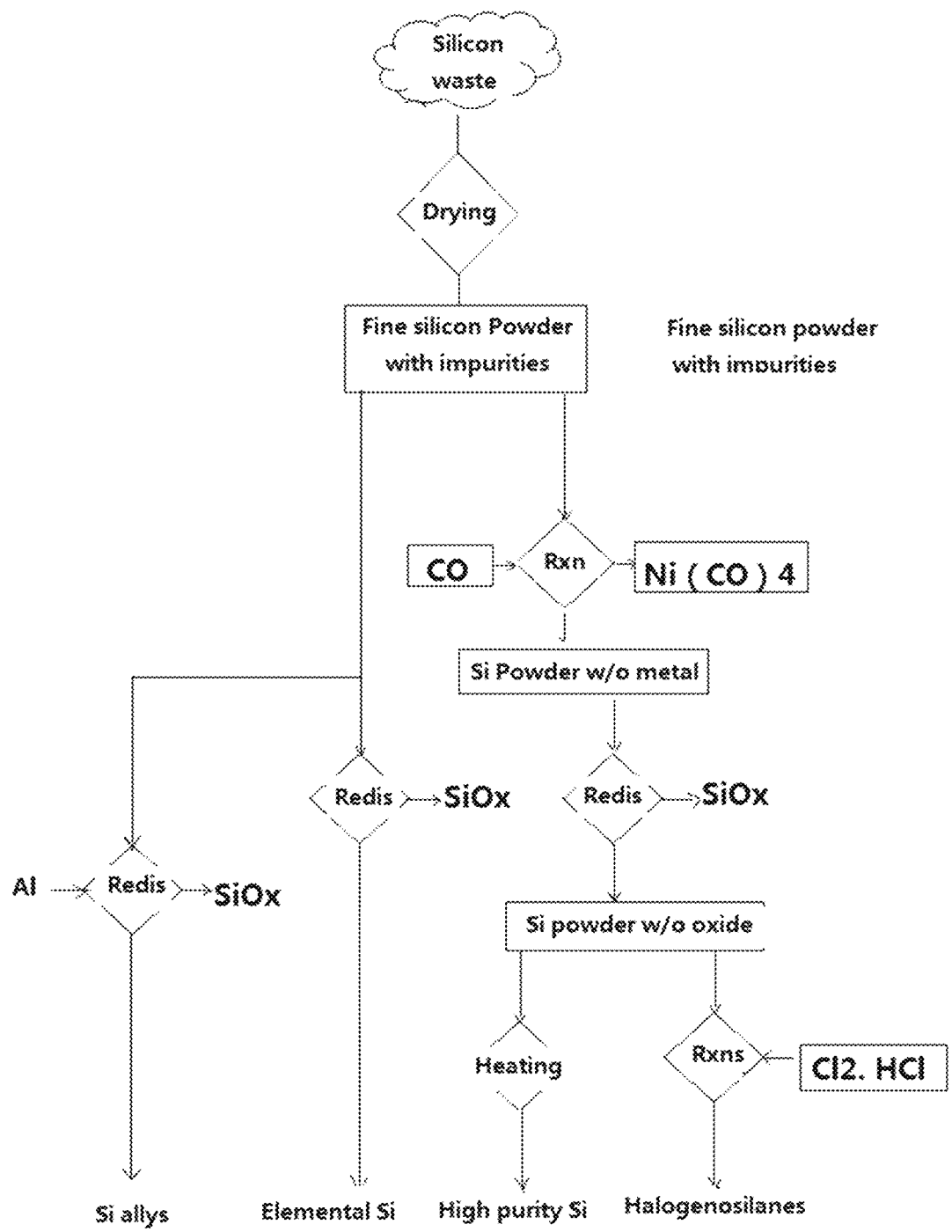
Figure 2C:
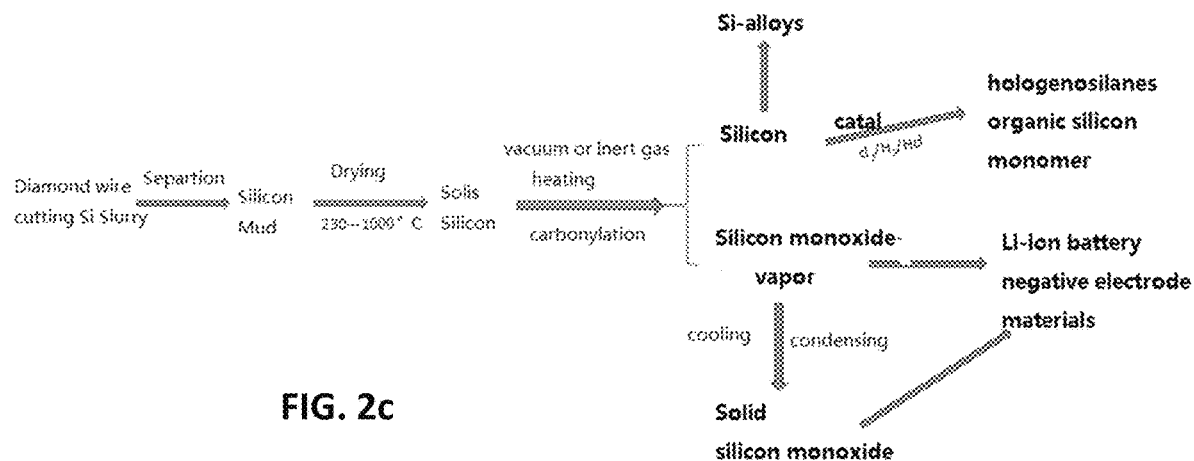

FIG. 1b and FIG. 1c are scanning electron micrographs (FIG. 1b) and X-ray diffraction patterns (FIG. 1c) of the dried silicon waste in Examples 1-4 before the reaction. It can be seen that there is no other crystalline material other than silicon, but the silicon oxide on the surface of the silicon particles is amorphous and has no diffraction peaks.

Firstly, the content of silicon and silicon oxide is quantitatively analyzed by thermogravimetry. The main idea is to completely oxidize the silicon in the sample to silicon dioxide under high temperature in air, and calculate the silicon content from increased mass. Based on the above analysis, the silicon and silica mixtures were analyzed by thermogravimetric method and the results were: 85% silicon and silica (15%) on its surface constituted more than 99% of the total mass.

The specific operation is as follows: 5 g of dried silicon waste is spread flat in a 150 mm×150 mm quartz tray, and heated in a muffle furnace at 1100° C. for more than 12 hours until all the silicon powder is converted into white silica (when the reaction is not complete, there is a yellowish component), and the heated white silica powder is weighed and compared with the raw material to obtain the silicon content. The following experiment gives a dynamic process in the oxidation reaction, which has a guiding effect on the actual operating temperature and time.

The experimental instrument was a DTG-60H thermogravimetric-differential thermal analyzer from Shimadzu Corporation of Japan. The experimental atmosphere was air, the flow rate was 50 mL/min, and the experimental crucible was 50 uL of open alumina crucible, and 5.0 mg of dried silicon powder was built in. Firstly, the experimental temperature range is determined by temperature scanning. The temperature program is: 10° C./min heating rate is heated from room temperature to 1400° C. It is found that the sample begins to increase weight above 500° C. This process corresponds to the oxidation of silicon elemental into silicon dioxide.

During the process the sample had a weight gain of 80.7% in the range of 520-1400° C. In order to completely oxidize the silicon in the sample to silica, it should be isothermal at 1000° C. or higher. For this purpose, an isothermal thermogravimetric experiment was performed at 1050° C. for isothermal 999 minutes. At 1050° C., the sample was weighted to 100% during the experiment, which corresponds to the process of oxidation of silicon elemental to silica. The sample before the experiment was dark brown, and the sample after the experiment turned white, indicating that all of the silicon became silicon dioxide Theoretically, for the $Si+O_2 \rightarrow SiO_2$ process, the weight gain should be $32/28*100\%=114.3\%$. In this experiment, the weight gain is 100%, and the content of silicon corresponding to the sample should be: $100/114.3*100\%=87.5\%$. Based on the above analysis, a quantitative analysis of a mixture of silicon and silicon oxide can be performed using a thermogravimetric method.

Example 2

Take 2000 g of the dried silicon waste material obtained in Example 1, place 2000 ml of graphite crucible, put it into a vacuum induction melting furnace (Shanghai Chenhua), first evacuate to a vacuum of 10-3 torr or less, and then flush it into high-purity argon gas and heat it up to 1500° C. During the heating process, silicon monoxide is formed and volatilized. After the silicon is melted (observed through the transparent window), it is cooled to room temperature, and 1400 g of crystal silicon (including the part that cannot be separated inside the crucible) was obtained. It can't be taken out in the crucible, and the weight of the crucible is increased by 30 grams. Its appearance is similar to that of polysilicon. The composition analysis is shown in Table 1. In addition, this experiment did not dock specifically to silicon monoxide collection equipment, and at the same time, some of the silicon oxide was not completely reacted. Only 5 grams of the sample was obtained from the inner wall of the vacuum melting furnace top cover. The silicon oxide content is shown in Table 2.

Example 3

Figure 3:
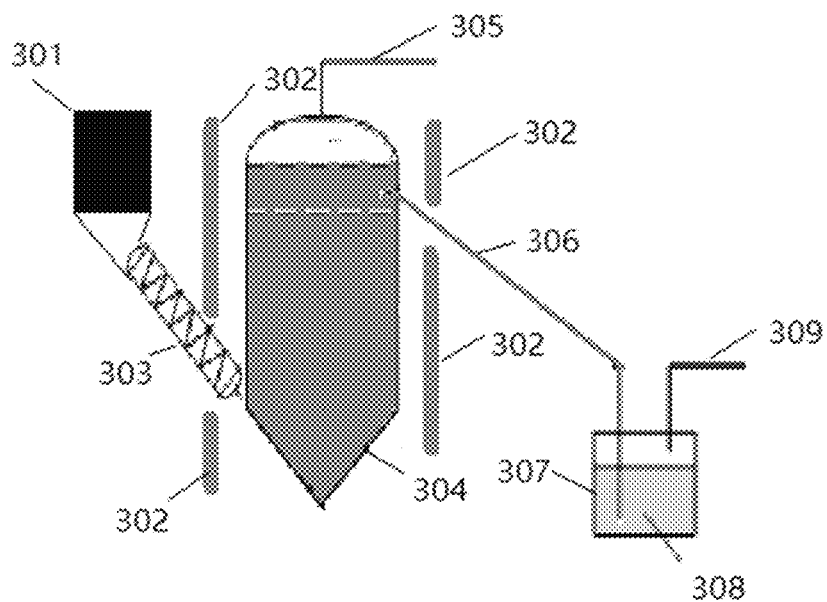
FIG. 3 is a schematic view showing the structure of an equipment for recovering elemental silicon (melt to bulk) and collecting silicon monoxide by reaction the surface oxide layer of diamond wire cut solid silicon waste particles with silicon in a specific embodiment of the present application.

As shown in FIG. 3, a 500 KW industrial melting furnace is equipped with a built-in graphite crucible of 200 liters. The top has a graphite cap. The 12-foot quartz tube is connected to a two-meter-diameter stainless steel drum with a diameter of 120 cm and then connected to a Roots blower to ensure that the stainless steel barrel has a continuous negative pressure (0.7-0.9 atm) and is externally cooled by tap water.

First, 25 kg of dry silicon powder is add to the graphite crucible (since the density of the silicon powder is lower, depending on the particle size distribution of the particles, generally 0.6-1.2 g/cc, which is much lower than the density of elemental silicon of 2.3 and the density of the melted silicon is greater than elemental silicon, up to 2.56). The induction heating element 2 equipment was started to heat up to 1500-1600° C. in 2 hours. When there is no silicon monoxide to overflow, heating was stopped, and then add 125 kg of dry silicon powder to the crucible in 5 times. Finally, approximately 45-50 liters of silicon melt is formed.

Keep the silicon melt in the crucible above 1500°, and inject silicon waste powder from the quartz tube through the bottom of the crucible through the feeder 303 (inner diameter 2-inch quartz tube). Since the feeding tube exchanges heat with the outside, when the lower temperature silicon powder is added, it is easy to solidify and cause difficulty in feeding. Therefore, the lower end of the feeding tube must be insulated, externally heated and fast fed to ensure continuous operation.

In the latter part of the experiment, the graphite crucible top cover was used to feed through the quartz tube to avoid the clogging problem. However, due to the shutdown, some silicon melt was oxidized to form silicon monoxide. Silicon powder was injected into the melter 304 (crucible) at a rate of 100-1000 g per minute until molten silicon was poured from the middle central pipe 306 into the collector 307 (quartz crucible) by about 10 liters, and 183 kg of silicon powder was added in a total of 7.0 hours. After cooling for 24 hours, the weight of the crucible was increased by 205 kg, and 34 kg of silicon was collected in the collector 307 (weighed after cooling), a total of 239 kg. The silicon content of the sample is shown in Table 1.

During the whole process, SiOx gas is discharged from the top through 305, and the system is blocked due to system blockage. In addition, this experiment did not dock specifically to a silicon monoxide collection equipment, but obtained 23 kg sample from the inner wall of the stainless steel barrel, and its silicon oxygen content is shown in Table 2.

Example 4: Elemental Silicon Powder

Figure 4:
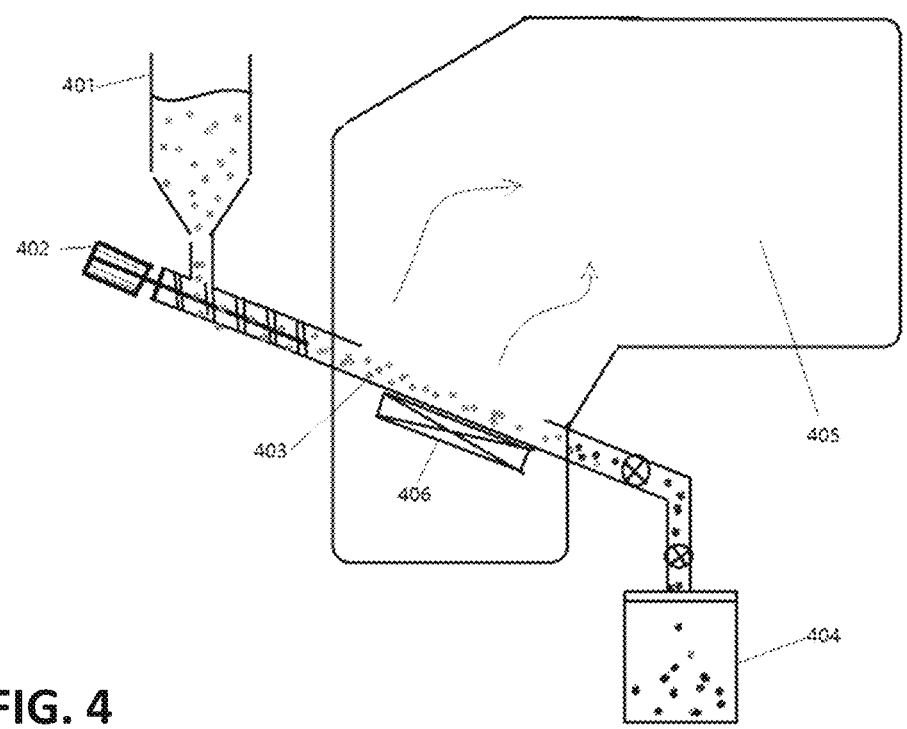
FIG. 4 is a schematic structural view of an apparatus for realizing the method for recovering elemental silicon (powder) and collecting silicon monoxide by reacting the surface oxide layer of the solid silicon waste particles according to an embodiment of the present application.

FIG. 4 shows another reactor of removing surface oxide layer of silicon waste powder, it is aimed to produce elemental silicon, and belongs to moving bed operation. The dried silicon waste powder is passed through a charging equipment 401 and 402 to heating section 403 which is open above the vacuum section and is connected to a vacuum collecting equipment 405 (the system is an inner diameter 20 mm T-type quartz tube, as in the heating furnace). Different from the previous reaction, the heating temperature is at 1375° C., lower than the melting point of silicon 1410° C. When the dry powder of silicon waste approaches and reaches the heating section, the oxide layer on the surface of the particle reacts with the internal elemental silicon to produce silicon monoxide vapor, which is taken out through the tube from the upper part of the open section to the collection chamber 405 connected to the vacuum machine (0.1 bar) until all the surface oxide layers are completely reacted, and the remaining silicon powder is elemental silicon powder is continuously pushed to the collection chamber 405.

The reaction was carried out for 2 hours, 300 g of silicon powder was added, and 220 gram of silicon powder was collected (some of the partially reacted silicon powder remaining in the reactor was not recorded), 0.21 g of silicon monoxide was collected from the top (partially not completely collected on the inner wall of the vessel).

Example 5: High Purity Silicon

Figure 5:
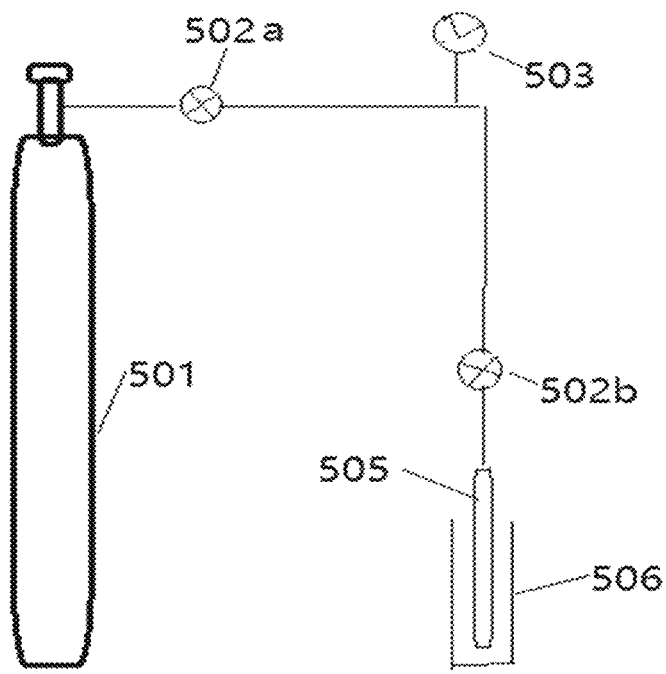
FIG. 5 is a schematic diagram of a carbonylation process for removing the transition metal in diamond wire cutting silicon sludge according to a specific embodiment of the present application.

As shown in FIG. 5, 500 g of silicon powder after drying, the same silicon powder as in Example 2, was placed in one end of a thick-walled stainless steel tube 505 (15 kg), and the end of the tube was welded and sealed, and placed in a heating tube 506, inside the tube. The air is drawn out and the other end is connected to a carbon monoxide cylinder 501 with a pressure gauge 503 and valves 502a and 502b. First, the carbon monoxide is flushed into the tube to 10 MPa, the valve is closed, and the reactor is heated to maintain the reactor at 110° C. The pressure in the tube decreases with the reaction of nickel and carbon monoxide (the number of moles of gas decreases), due to the continuous metal nickel and iron in the dry powder of silicon waste. A carbonylation reaction with carbon monoxide.

When the pressure drops to 1.0 MPa, the valve is opened and carbon monoxide is added to the tube to return the pressure to 10 MPa and then the valve is closed. As the reaction proceeded, the pressure inside the tube was continuously reduced to 5.0 MPa and then restarted until the pressure in the reactor did not change significantly, indicating that all transition metal carbonylation reactions were completed Subsequently, the reactor is separated from the cylinder, moved to the suction cabinet, and the gas in the reactor is released to obtain a dry powder for removing metal impurities. Since the content of the metal impurities is small, the reactor is heavier, and the weight loss of the sample after carbonylation cannot be accurately determined. 493 g of treated silicon powder.

Using the same vacuum melting furnace of Example 2, 200 g of the dried and removed transition metal silicon sludge was weighed use a graphite crucible and was taken into a vacuum melting furnace, and the vacuum was first evacuated to $10^3$ torr or less, then pure argon gas was introduced. At 1500° C., silicon monoxide is formed and volatilized, after all silicon is melt observed through the transparent window, the furnace was cooled down naturally, 150 g crystalline silicon (crucible weight gain) with appearance similar to polysilicon was obtained, this embodiment is used for test the effect of carbonylation for metallic impurities removal.

Table 1 compares the metal content (mg/kg) of elemental silicon and metal-removed silicon powder and high-purity silicon, using an inductively coupled plasma emission spectrometer, model: ICO2060. The comparison samples were from the National Institute of Nonferrous Metals Research. It can be seen that the removal effect of metallic nickel Ni and iron Fe is very obvious.

TABLE 1

Comparison table of metal content in silicon and high-purity silicon after elemental silicon and metal removal (mg/kg)

| Metal element | Example 2 (elemental silicon) | Example 5 (silicon powder obtained after metal removal) | Example 5 (high purity silicon) |
|---|---|---|---|
| Fe | 799.42 | 2 | 3 |
| Mn | ND | ND | ND |
| Ni | 82.505 | 3 | 2 |
| Ca | 26 | 0.5 | 1 |
| Co | ND | ND | ND |

Among them, Example 2 is the elemental silicon obtained after the disproportionation reaction, without metal removed. The disproportionation reaction means that silicon reacts with silicon dioxide.

Wherein Example 5 (silicon powder obtained after removing metal) means that the metal is removed by a carbonylation reaction, but no disproportionation reaction occurs, and the disproportionation reaction means that silicon and silicon dioxide react.

Disproportionation reaction refers to reacting silicon and silicon dioxide.

Where mg/kg represents the amount of metal per kilogram of silicon waste obtained from a commercial silicon cutting plant.

Example 6

Figure 6:
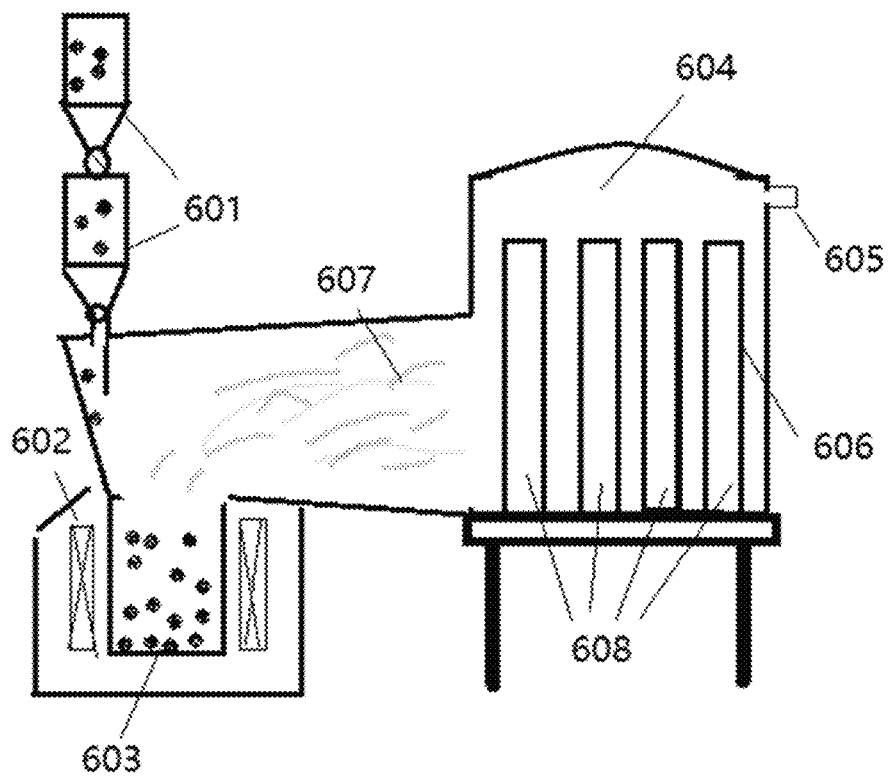
FIG. 6 is a schematic structural view of a distributor-less gas-solid deposition apparatus for realizing the generated silicon monoxide generated by bulk collection according to an embodiment of the present application.

As shown in FIG. 6, using the same sample A as in Example 1, silicon oxide was coexisting with silicon, and in the case where the silicon content was known to be 87%, the microwave was heated in the air every time to make the sample 10 kg to the hot 800-1000° C., weight increase of 30-50% (when elemental silicon and silica molars are the same, silicon powder weight gains 45.7%), the degree of oxidation in the experiment is closely related to the accumulation of silicon powder, the particles should be fully in contact with oxygen in the air, which In the process of industrialization, it can be further optimized by standard chemical operation.

The obtained powder is brownish black, and the powder is pressed into a block (preventing the powder from being vacuumed out in the reaction), and is broken into a silicon oxide precursor having a particle size of 3-10 mm. The granules, silicon monoxide precursor particles or powder are added to the reactor by a double lock hopper 601 and fall into the quartz crucible 603, which is heated by the graphite heating element 602 to 1350-1400° C.

The sublimated silicon monoxide 607 overflows from the crucible drifting to the collection chamber 604 (the collection chamber 004 maintains a negative pressure) and depositing on the surface of the tubular substrate 606, the tubular 006 substrate is two pairs of inverted U-shaped stainless steel tubes of three-eighths of an inch, 40 cm high, 20 cm apart, hollow internal communication The tap water 608 is cooled, and the outlet water temperature is kept at 30° C. After waiting for the deposition of the silicon oxide on the substrate, the deposition of the outer diameter of the tube reaches 5 cm after 34 hours to terminate the deposition, the product is removed, and the weight is found to be 5.7. Kg SiO2. The yield is less than 30% after comparative feeding. This is because the entire deposition surface area is too small, especially when starting to deposit, large-scale production, multi-rod structure can be adopted to improve the entire deposition surface area. Accept the purpose of efficiency.

Example 7

Figure 7A:
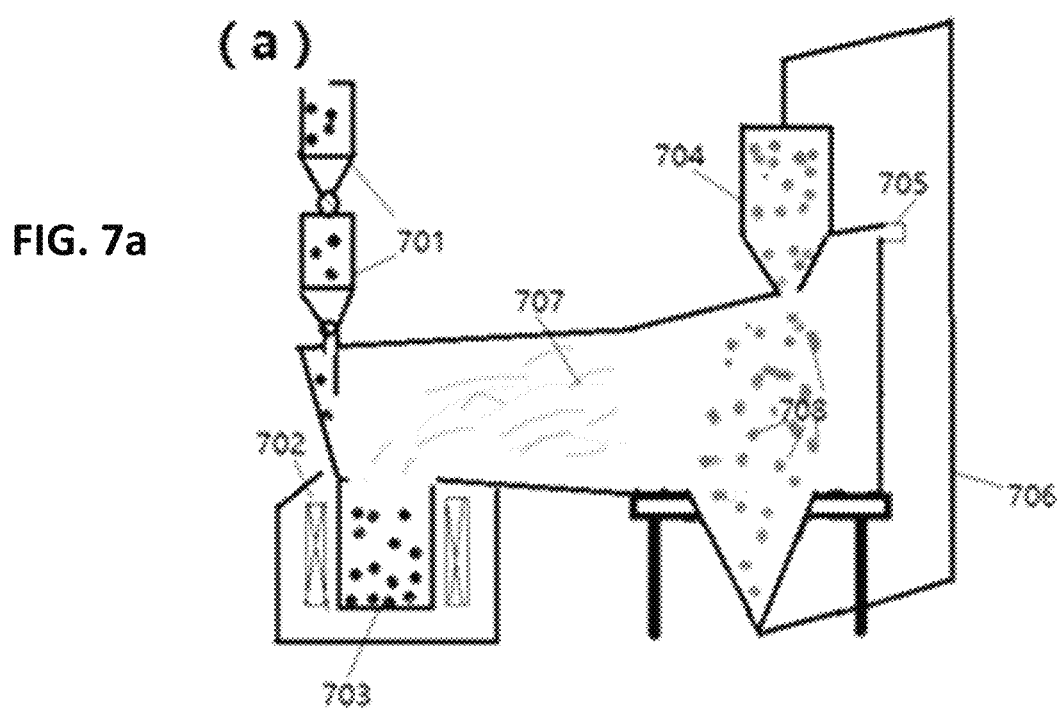
FIG. 7 is a schematic structural view of a distributor-less gas-solid deposition apparatus for realizing the continuous collection of the generated silicon monoxide in the form of particles according to an embodiment of the present application.

As shown in FIG. 7a, the same sample as in Example 6 was used to prepare silicon monoxide precursor particles having a particle size of 3 to 10 mm, which were fed into the reactor by a double lock hopper 701, and dropped into crucible 703, which was heated by graphite heating element 702 to 1400° C., and the sublimated silicon monoxide 707 is floated by a helium overflow to the collection chamber and deposited on the surface of the granular silicon monoxide substrate 708, 705 is a vacuum outlet, and a shutter-type block is provided on the left side of the vacuum outlet 705. (see FIG. 7b). 706 is a particle circulator, which is transported from the bottom tank to the top of the apparatus by an in-line vacuum using 0.3 MPa argon Ar as the drive source.

Figure 7B:
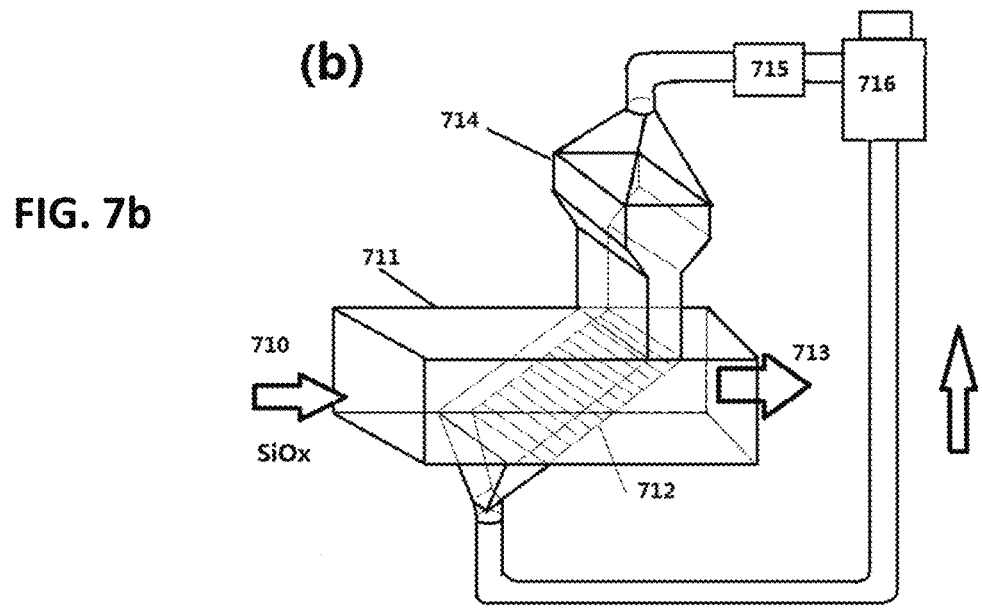

In FIG. 7b, reactor chamber 711 has a silicon monoxide inlet 710 and an outlet 713, and a ladder distributor 712 is mounted inside the reactor chamber 711. The bottom of the reactor chamber 711 is connected to the vacuum loader 716 by a pipe; the top of the reactor chamber 711 is connected to the particle disperser 714, and the pipe between the step distributor 712 and the vacuum feeder 716 is provided with particle screening equipment 715.

The particles are evenly distributed by the particle disperser 714 on the step distributor 712, and then the particles move to the bottom uninterrupted cycle, and in the reactor cavity 711, the surface thereof is kept in full contact with the silicon monoxide vapor and the particle size thereof is continuously grown. Under the same conditions as in Example 6, the particles of the silicon monoxide were increased in weight to 18.3 kg, and the efficiency was remarkably improved. There is also a screening equipment 704 between the particle circulator 706 and the top to allow large particles to be discharged, and the small particles are transported to the top to continue to circulate within the reactor and grow. When there are too few small particles in the system, it can be added to ensure that the system operates in a steady state.

The composition analysis of the silicon oxide produced in Example 2-6 was carried out by the method of Example 1. Table 2 lists the oxygen to silicon ratio of the silicon monoxide SiOx prepared in each of the examples, and the method employed is the weighting method described in Example 1 of the present application. It can be seen that the silicon to oxygen ratio is very close, but when the temperature is high, the proportion of silicon is relatively high, which may be the reason for the higher vapor pressure of elemental silicon.

TABLE 2

| Silicon to oxygen ratio of silicon oxide in the examples | | |
|---|---|---|
| EXAMPLES | Condition | The value of X in SiOx Si |
| Example 2 | Vacuum Melting | 0.99 |
| Example 3 | Continuous Melting | 0.97 |
| Example 4 | Elemental silicon powder | 0.98 |
| Example 5 | High Purity Silicon Melting | 0.98 |
| Example 6, 7 | Separate production of silicon oxide | 1.02 |

Example 8

3.5 kg (calculated as elemental silicon) of the same dried silicon powder as in Example 1 was mixed with aluminum powder 10 mesh 30 kg at 10% and 90%, and added to the melter. FIG. 3 (aluminum powder cover on silicon powder), at 700° C. Under the condition of, a silicon-aluminum alloy was produced, the silicon content was 9.8%, and the silicon oxide was overflowed, and was not collected.

Example 9

Figure 8:
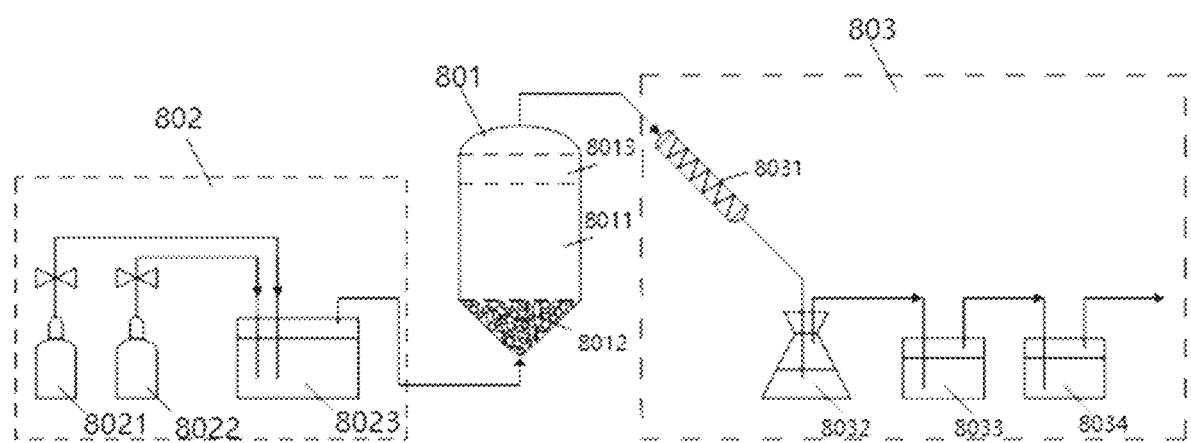
FIG. 8 is a schematic structural view of an apparatus for realizing the disproportionation reaction of diamond wire cutting silicon waste for the continuous production of the chlorosilanes according to a specific embodiment of the present application.

The silicon powder with and without the oxide layer was compared, and the same sample as in Example 1, except that (a) was dried only, (b) was ground in a protective atmosphere (argon) for 100 minutes, and (c) was obtained from Example 4. A fixed bed reactor (see FIG. 8) is used: a quartz tube reactor with an inner diameter of 50 mm, with a tapered bottom and a central main reaction zone (heating section) of 300 mm, with a block of quartz (3-15 mm) filling cone form a gas distributor, add 30 grams of dry silicon waste powder (30-100 mesh) in the middle main reaction zone, and the upper part of the reactor is filled with quartz wool (laboratory small test uses quartz wool at the product gas outlet), to prevent the powder from being carried out of the reactor when the gas flow is unstable. The reactor product gas outlet is connected to a water condensation tube, a liquid collection bottle is connected downstream of the condensation tube, and the tail gas passage is passed through the alkali washing tank.

First, after heating in nitrogen at 250-300° C. (set temperature 270° C.), switch to gas HCl for reaction, control HCl gas flow rate to 100 ml/min, hold at 300-350° C. for 2 hours, condense collection Reactant. For the sample (a), no reaction product was collected, indicating that the silicon waste with the oxide layer did not participate in the reaction; for the sample (b), 120 and 130 g of the transparent liquid were respectively received, and the chemical analysis was that the main component was 70% SiHCl3. The remaining 29.95% is SiCl4, and other impurities are less than 0.05%. In the reactor (c), the sample silicon waste basically disappeared, indicating that most of the silicon was consumed during the reaction.

Example 10

Three samples (a), (b) and (c) which were substantially identical to the conditions of the method of Example 10, except that the reaction gas was changed from HCl to 100 ml/min $Cl_2$, and the reaction temperature was raised to 500-900° C. (setting at 700° C.), during the reaction, due to the heat of reaction, the actual temperature reached 1100° C. in the intermediate stage, and the reaction time was reduced to one hour.

Different from the implementation example 9, the sample (a) also participates in the reaction, and after the reaction temperature is raised, the surface oxide layer of the sample (a) is reacted with the internal elemental silicon to be removed, and the internal elemental silicon is exposed and participated. The reaction with chlorine. After the reaction gas after the reaction of the samples (a) and (b) was condensed, 150 g of a transparent liquid was collected, and 173 g of the sample (c) was obtained, and the chemical analysis was that the purity of the SiCl4 silicon tetrachloride was 99.5% or more.

Example 11

As in the case of Example 9, only 10% by weight of $CuCl_2$ catalyst was added to the powder, and the gasification gas feed was 100 ml/min HC. The condensed product did not change significantly, and the reactor reaction start-up time (from heating to condensation) The time when the first drop of chlorosilane appeared in the equipment was significantly reduced, the reaction was accelerated, and the entire reaction time was only one third of that of Example 9.

The above description is only for the preferred embodiment of the present application, and is not intended to limit the present application, and various changes and modifications may be made to the present application. Any modifications, equivalent substitutions, improvements, etc. made within the spirit and principles of this application are intended to be included within the scope of the present application.

INDUSTRIAL APPLICABILITY

The present application utilizes the characteristics of a thick oxide layer ($SiO_2$) generated during diamond wire cutting on the surface of the silicon waste particle (Si), and use it to react with inside silicon to form a silicon monoxide sublimation, and to achieve the purpose of removing the surface oxide layer, thereby through physicochemical reaction of a metal, a halogen gas, a hydrogen halide gas or hydrogen, makes it possible to further convert the silicon sludge into elemental silicon, a silicon alloy, and a halosilane, thereby producing a high value-added silicon-containing industrial product. At the same time, it has produced more valuable silicon oxides that can be used in many fields. This eliminates disadvantages in conventional method of removing the silicon oxide layer by pickling, adding a reducing agent, etc., having a high cost, environmental pollution, and waste of silicon material.

What is claimed is:

1. A method of producing silicon monoxide, the method comprising:

providing precursor particles having elemental silicon coated with an initial layer of silicon dioxide necessary to produce silicon monoxide;

oxidizing the precursor particles to produce a raw material including a thicker coating of silicon dioxide on surfaces of the precursor particles, the thicker coating having a thickness greater than the initial layer;

subjecting the raw material to a disproportionation reaction at a reaction temperature of 1200° C. to 1800° C., such that silicon dioxide and elemental silicon in the raw material react to sublimate silicon monoxide into sublimated silicon monoxide vapor; and performing a deposition condensation process and collecting the sublimated silicon monoxide vapor onto an external surface of a collection plate, a rod, or particles in a particle bed to obtain silicon monoxide solid from the sublimated silicon monoxide vapor.

2. The method of claim 1, wherein, after oxidizing the precursor particles, the molar ratio of elemental silicon to silicon dioxide in the raw material is approximately 1:1.

3. The method of claim 1, wherein the silicon monoxide is SiOx, wherein x is between 0.5 and 1.5.

4. The method of claim 1, wherein the silicon monoxide is sublimated, via the disproportionation reaction, at a reaction pressure of 0.01 to 100 Mpa.

5. The method of claim 1, wherein the deposition condensation process of the silicon monoxide solid is carried out in a collection chamber, the collection chamber being a fluidized bed, a dilute phase flow bed, a spray spouted bed, a fixed bed, a moving bed, or a combination thereof.

6. The method of claim 1, wherein, prior to providing precursor particles, the precursor particles are subjected to at least one of air drying, spray drying, fluidized bed drying, rotary flash drying, infrared drying, microwave drying, freeze drying, impact drying, collision drying, superheat drying, pulsation combustion drying, heat pump drying, or a combination thereof.

7. The method of claim 1, wherein the silicon monoxide vapor is collected onto the exterior surface of a collection plate or rod; and wherein the collection plate or rod onto which the sublimated silicon monoxide vapor is condensed is incorporated into a lithium-ion battery as a negative electrode after collection of the sublimated silicon monoxide vapor onto the collection plate or rod.

8. The method of claim 1, wherein the subjecting the raw material to a disproportionation reaction at the reaction temperature occurs in a vacuum.

9. The method of claim 1, wherein the precursor particles comprising elemental silicon coated with silicon dioxide are the byproduct of cutting a silicon wafer with a diamond wire.

10. The method of claim 4, wherein the silicon monoxide is sublimated, via the disproportionation reaction, at a reaction pressure of 0.01 to 0.1 Mpa.

* * * * *